(12) United States Patent
Godo

(10) Patent No.: US 7,598,526 B2
(45) Date of Patent: Oct. 6, 2009

(54) SEMICONDUCTOR DEVICE AND MANUFACTURING METHOD THEREOF

(75) Inventor: Hiromichi Godo, Atsugi (JP)

(73) Assignee: Semiconductor Energy Laboratory Co., Ltd., Atsugi-shi, Kanagawa-ken (JP)

( * ) Notice: Subject to any disclaimer, the term of this patent is extended or adjusted under 35 U.S.C. 154(b) by 35 days.

(21) Appl. No.: 11/713,620

(22) Filed: Mar. 5, 2007

(65) Prior Publication Data

US 2007/0210379 A1    Sep. 13, 2007

(30) Foreign Application Priority Data

Mar. 8, 2006    (JP) .............................. 2006-062435

(51) Int. Cl.
*H01L 29/04*    (2006.01)
(52) U.S. Cl. ......................................... 257/72; 438/159
(58) Field of Classification Search .................. 257/59, 257/72, 66, E29.137, E29.273; 438/149, 438/159
See application file for complete search history.

(56) References Cited

U.S. PATENT DOCUMENTS

| 5,726,459 | A | 3/1998 | Hsu et al. |
|---|---|---|---|
| 5,953,598 | A | 9/1999 | Hata et al. |
| 6,005,270 | A | 12/1999 | Noguchi |
| 6,388,291 | B1 | 5/2002 | Zhang et al. |
| 6,433,361 | B1 | 8/2002 | Zhang et al. |
| 7,023,052 | B2 | 4/2006 | Yamazaki et al. |
| 7,339,190 | B2 * | 3/2008 | Chen et al. .................... 257/66 |
| 2007/0020888 | A1 | 1/2007 | Yamazaki et al. |
| 2007/0228420 | A1 | 10/2007 | Takano et al. |

FOREIGN PATENT DOCUMENTS

| JP | 06-314785 | 11/1994 |
|---|---|---|
| JP | 07-176753 | 7/1995 |
| JP | 08-018055 | 1/1996 |
| JP | 2006-013534 | 1/2006 |

OTHER PUBLICATIONS

Colinge, J., Silicon-On-Insulator Technology: Materials to VLSI $2^{nd}$ Edition, Chapter 4: SOI CMOS Technology, Jan. 1991, p. 108-109.

* cited by examiner

*Primary Examiner*—David Vu
(74) *Attorney, Agent, or Firm*—Eric J. Robinson; Robinson Intellectual Property Law Office, P.C.

(57) ABSTRACT

It is an object to reduce the effect of a characteristic of the edge portion of a channel forming region in a semiconductor film, on a transistor characteristic. An island-like semiconductor film is formed over a substrate, and a conductive film forming a gate electrode provided over the island-like semiconductor film with a gate insulating film interposed therebetween, is formed over the semiconductor film. In the semiconductor film, a channel forming region, a first impurity region forming a source or drain region, and a second impurity region are provided. The channel forming region is provided in a region which overlaps with the gate electrode crossing the island-like semiconductor film, the first impurity region is provided so as to be adjacent to the channel forming region, and the second impurity region is provided so as to be adjacent to the channel forming region and the first impurity region. The first impurity region and the second impurity region are provided so as to have different conductivity, and the second impurity region and the channel forming region are made to have different conductivity or to have different concentration of an impurity element contained in the second impurity region and the channel forming region in a case of having the same conductivity.

4 Claims, 23 Drawing Sheets

$A_3$ 101 102 103 104 $B_3$ $A_3$ 125a 125b 125 $B_3$ 121
123
$A_3$ $B_3$ 108 122 108
103c 103b 103c
$A_3$ $B_3$ 107 106
$A_3$ $B_3$

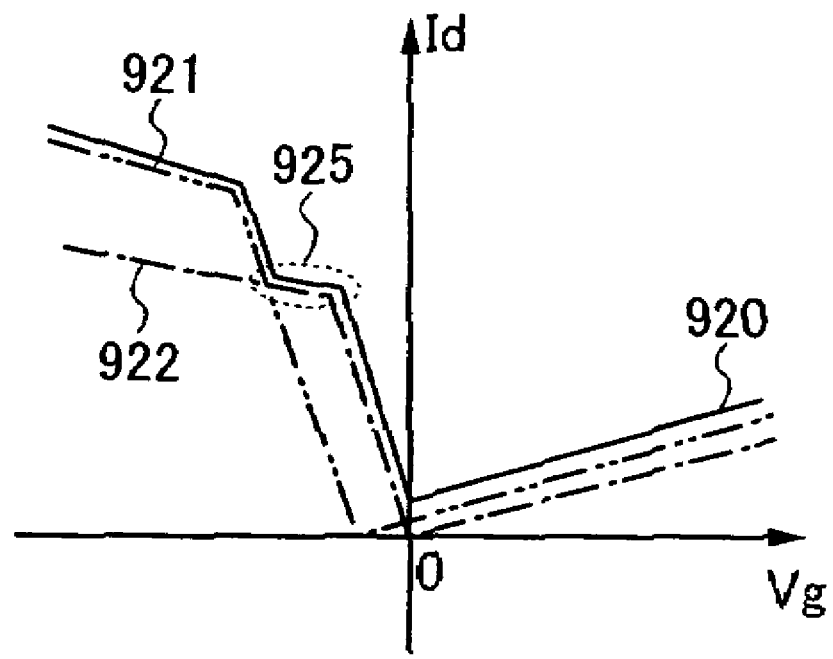
FIG. 20A p-channel type TFT
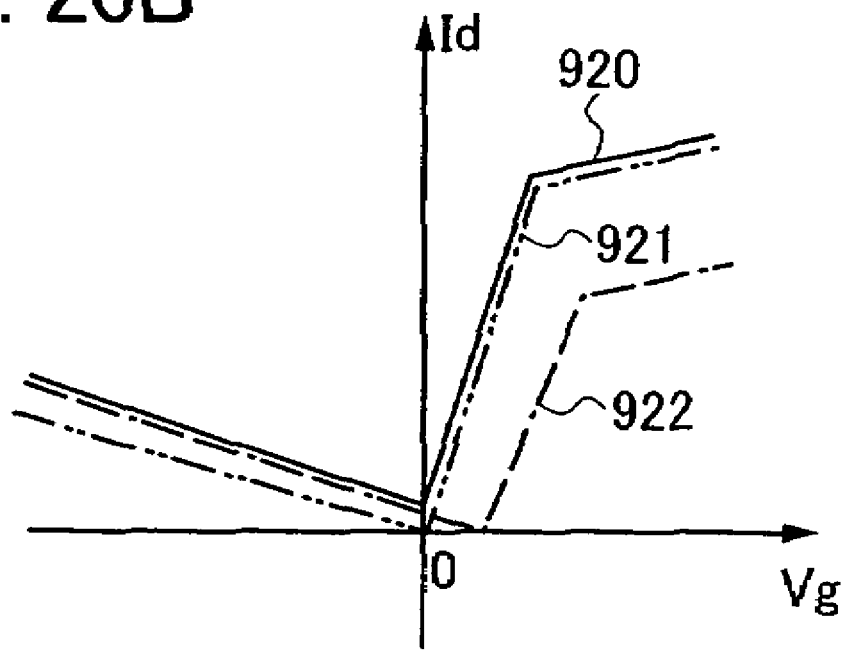
FIG. 20B n-channel type TFT

SEMICONDUCTOR DEVICE AND MANUFACTURING METHOD THEREOF

BACKGROUND OF THE INVENTION

1. Field of the Invention

The present invention relates to a semiconductor device and a manufacturing method thereof.

2. Description of the Related Art

In recent years, a semiconductor device has been actively manufactured, in which thin film transistors (TFTs) are formed over a substrate having an insulating surface, such as a glass substrate, and the thin film transistors are used as switching elements or the like. The thin film transistors are formed so that island-like semiconductor films are formed over a substrate having an insulating surface by a CVD method, a photolithography step, or the like, and parts of the island-like semiconductor films are used as channel forming regions of transistors. (for example, Patent Document 1: Japanese Published Patent Application No. H08-018055)

FIGS. 17A to 17C are schematic views of a general thin film transistor. First, a thin film transistor has, over a substrate 901, an island-like semiconductor film 903 with an insulating film 902 serving as a base film interposed therebetween, and a conductive film 905 serving as a gate electrode with a gate insulating film 904 interposed therebetween. The conductive film 905 is provided so as to cross the island-like semiconductor film 903. The semiconductor film 903 has a channel forming region 903a formed in a region which overlaps with the conductive film 905, and an impurity region 903b forming a source region or drain region. Further, a conductive film 907 forming a source electrode or drain electrode is provided so as to be electrically connected to the impurity region 903b. FIGS. 17B and 17C show cross-sectional structures taken along lines $C_1$-$D_1$ and $C_2$-$D_2$, respectively, in FIG. 17A.

SUMMARY OF THE INVENTION

However, in a case where a semiconductor film is formed in an island-like shape, level difference is generated in the edge portion of the semiconductor film, leading to a problem that coverage by a gate insulating film is not sufficiently performed. In particular, in recent years, a gate insulating film is desired to be thinned in order to improve low power consumption and operation speed of a thin film transistor. Therefore, in a case where a gate insulating film is provided to be thin, a coverage defect of the edge portion of a semiconductor film becomes a more notable problem. In a case where coverage of the gate insulating film in the edge portion of the semiconductor film is not sufficiently performed, short-circuit may occur in the edge portion of the semiconductor film by contact between a conductive film forming the gate electrode and the semiconductor film. Further, when the gate insulating film in the edge portion of a channel forming region of the semiconductor film is formed to be thin, current leaks in a gate electrode and the edge portion of the channel forming region of the semiconductor film, leading to a problem such as deterioration of a transistor characteristic.

Furthermore, in a case where a fixed charge is trapped in the edge portion of the semiconductor film due to break of the gate insulating film or treatment in a manufacturing process, a characteristic of a channel forming region in the edge portion is changed as compared with the central portion of the semiconductor film, leading to a problem of the effect on a characteristic of a thin film transistor.

In view of the foregoing problems, it is an object of the present invention to provide a semiconductor device which reduces the effect of a characteristic of the edge portion of a channel forming region in a semiconductor film, on a transistor characteristic, and a manufacturing method of the semiconductor device.

According to one feature of the present invention, a semiconductor device includes an island-like semiconductor film formed over a substrate; and a conductive film forming a gate electrode provided over the semiconductor film with a gate insulating film interposed therebetween, where the semiconductor film has a channel forming region; a first impurity region forming a source region or drain region; and a second impurity region. The channel forming region is formed in a region which overlaps with the gate electrode crossing the island-like semiconductor film. The first impurity region is provided so as to be adjacent to the channel forming region, and the second impurity region is provided so as to be adjacent to the channel forming region and the first impurity region. The first impurity region and the second impurity region have different conductivity from each other. The second impurity region and the channel forming region have different conductivity from each other or have different concentration of an impurity element from each other in a case of having the same conductivity.

In the above structure, the second impurity region, which is in the edge portion of the semiconductor film, is provided so as to be adjacent to a region which overlaps with the gate electrode. The second impurity region may be provided in a region which does not overlap with the gate electrode, or may be provided in the region which does not overlap with the gate electrode and in a region which overlaps with the gate electrode.

According to another feature of the present invention, a semiconductor device includes a first semiconductor film formed in an island-like shape and a second island-like semiconductor film, over a substrate; and a gate electrode formed over the first semiconductor film and the second semiconductor film with a gate insulating film interposed between the gate electrode and the first semiconductor film and second semiconductor film, where the first semiconductor film has a first channel forming region provided in a region which overlaps with the gate electrode with the gate insulating film interposed therebetween; a first impurity region forming a source region or drain region, provided so as to be adjacent to the first channel forming region; and a second impurity region provided so as to be adjacent to the first channel forming region and the first impurity region, where the second island-like semiconductor film has a second channel forming region provided in a region which overlaps with the gate electrode with the gate insulating film interposed therebetween; a third impurity region forming a source region or drain region; and a fourth impurity region provided so as to be adjacent to a region between the second channel forming region and the third impurity region. The conductivity of the first impurity region is different from that of the second impurity region, the third impurity region, and the fourth impurity region, and the second impurity region and the fourth impurity region have an impurity element at substantially the same concentration.

According to another feature of the present invention, a manufacturing method of a semiconductor device includes the steps of forming an island-like semiconductor film over a substrate; forming a conductive film serving as a gate electrode with a gate insulating film interposed therebetween so as to cross the semiconductor film; introducing a first impurity element into the semiconductor film with the conductive film being used as a mask; selectively forming a resist in the edge portion of the semiconductor film; and by introduction of a second impurity element having conductivity different from that of the first impurity element in the semiconductor film with the resist and the conductive film being used as masks, in the semiconductor film, forming a channel forming region in a region which overlaps with the conductive film, forming a first impurity region having the same conductivity as that of the second impurity element so as to be adjacent to the channel forming region, and forming a second impurity region having same conductivity as that of the first impurity element so as to be adjacent to the channel forming region and the first impurity region. The second impurity region, which is in the edge portion of the semiconductor film, is formed so as to be adjacent to a region which overlaps with the conductive film.

According to another feature of the present invention, a manufacturing method of a semiconductor device includes the steps of forming a first semiconductor film and a second semiconductor film in an island-like shape over a substrate; forming a conductive film serving as a gate electrode with a gate insulating film interposed therebetween, so as to cross the first semiconductor film and the second semiconductor film; introducing a first impurity element into the first semiconductor film and the second semiconductor film with the conductive film being used as a mask; forming a first resist so as to cover the edge portion of the first semiconductor film and the entire surface of the second semiconductor film; by introduction of a second impurity element having conductivity different from that of the first impurity element in the first semiconductor film with the first resist and the conductive film being used as masks, in the first semiconductor film, forming a first channel forming region in a region which overlaps with the conductive film, forming a first impurity region having the same conductivity as that of the second impurity element so as to be adjacent to the first channel forming region, and forming a second impurity region having the same conductivity as that of the first impurity element so as to be adjacent to the first channel forming region and the first impurity region; forming an insulating film to be in contact with the side surface of the conductive film; forming a second resist so as to cover the entire surface of the first semiconductor film; and by introduction of a third impurity element having conductivity different from that of the second impurity element in the second semiconductor film with the conductive film and the insulating film being used as masks, in the second semiconductor film, forming a second channel forming region in a region which overlaps with the conductive film, forming a fourth impurity region having the same conductivity as that of the first impurity element in a region which is adjacent to the second channel forming region and which overlaps with the insulating film, and forming a third impurity region having the same conductivity as that of the third impurity element so as to be adjacent to the fourth impurity region.

In the edge portion of an island-like semiconductor film which overlaps with a conductive film serving as a gate electrode, an impurity region having conductivity different from that of a source region or a drain region is provided so as to be adjacent to the edge portion, whereby the effect of a characteristic of the edge portion of a channel forming region of the semiconductor film, on a transistor can be reduced.

BRIEF DESCRIPTION OF THE DRAWINGS

In the accompanying drawings:

FIGS. 20A and 20B are explanatory graphs of an embodiment of a semiconductor device of the present invention;

DETAILED DESCRIPTION OF THE INVENTION

Figure 1A:
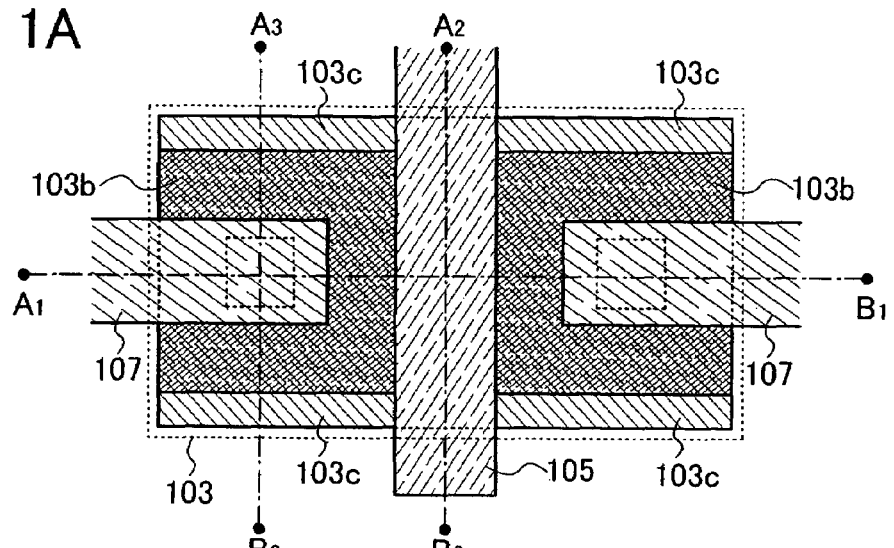
FIGS. 1A to 1D are views of one example of a semiconductor device of the present invention.

Embodiment Modes of the present invention will be explained below with reference to the accompanied drawings. However, the present invention is not limited to explanation to be given below, and it is to be easily understood that various changes and modifications in modes and details thereof will be apparent to those skilled in the art without departing from the purpose and the scope of the present invention. Therefore, the present invention should not be interpreted as being limited to the description of the embodiment modes to be given below. It is to be noted that, in embodiment of the present invention which will be explained below, there is a case that the same portions are denoted by the same reference numerals through different drawings.

Embodiment Mode 1

In this embodiment mode, one example of a semiconductor device of the present invention will be explained with reference to the drawings.

Figure 1B:
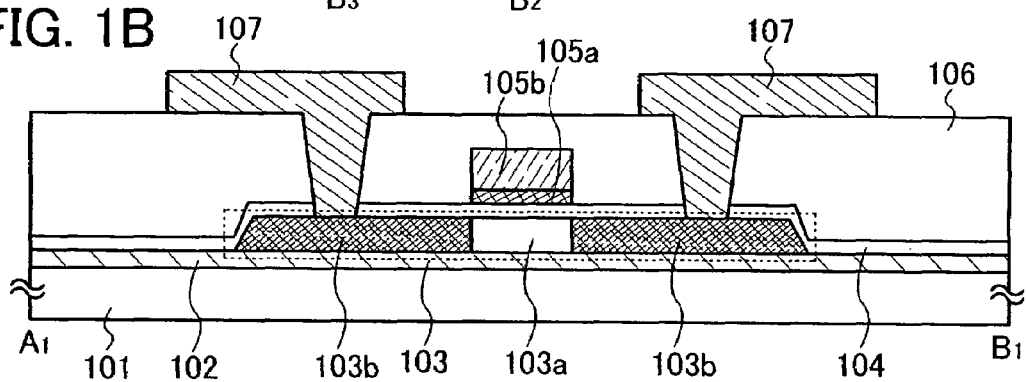
Figure 1C:
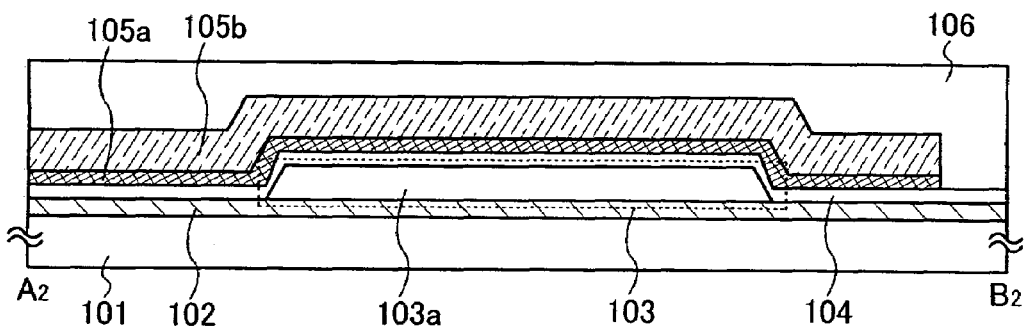
Figure 1D:
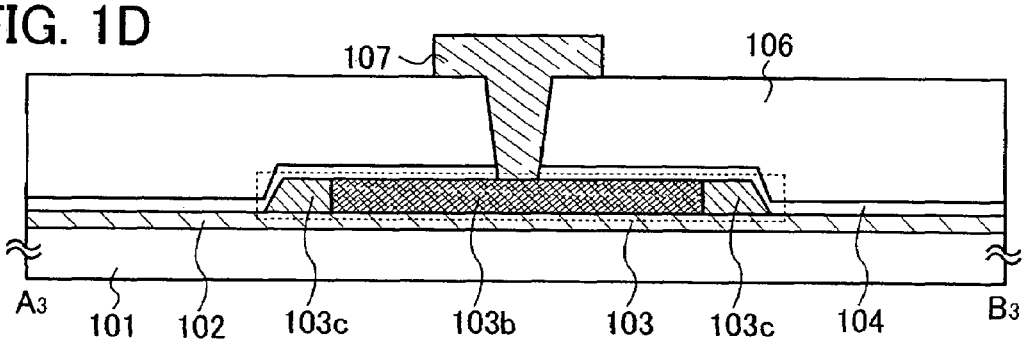

FIGS. 1A to 1D show a semiconductor device described in this embodiment mode. FIG. 1A is a top view of a semiconductor device described in this embodiment mode, FIG. 1B is a cross-sectional view taken along a line $A_1$-$B_1$ in FIG. 1A, FIG. 1C is a cross-sectional view taken along a line $A_2$-$B_2$ in FIG. 1A, and FIG. 1D is a cross-sectional view taken along a line $A_3$-$B_3$ in FIG. 1A.

A semiconductor device described in this embodiment mode has a thin film transistor including a semiconductor film 103 provided in an island-like shape over a substrate 101 with an insulating film 102 interposed therebetween, and a conductive film 105 forming a gate electrode provided above the semiconductor film 103 with a gate insulating film 104 interposed therebetween; an insulating film 106 provided so as to cover the gate insulating film 104 and the conductive film 105; and a conductive film 107 forming a source electrode or drain electrode provided over the insulating film 106 (FIGS. 1A to 1D).

The conductive film 105 forming a gate electrode is provided so as to cross the island-like semiconductor film 103. Here, a case where the conductive film 105 is provided so as to have a structure in which a first conductive film 105a and a second conductive film 105b are stacked is shown; however, the present invention is not limited thereto, and the conductive film 105 may have a single-layer structure or a structure in which three or more layers are stacked.

The semiconductor film 103 provided in an island-like shape has a channel forming region 103a provided in a region which overlaps with the conductive film 105, with the gate insulating film 104 interposed between the conductive film 105 and the channel forming region 103a; a first impurity region 103b forming a source region or drain region provided so as to be adjacent to the channel forming region 103a, in a region which does not overlap with the conductive film 105; and a second impurity region 103c provided so as to be adjacent to the channel forming region 103a and the first impurity region 103b, in a region which does not overlap with the conductive film 105.

The conductive film 107 forming a source electrode or drain electrode is provided so as to be electrically connected to the first impurity region 103b through an opening portion formed in the insulating film 106.

The first impurity region 103b and the second impurity region 103c are provided so as to have different conductivity. For example, in a case where the first impurity region is provided so as to have n-type conductivity, the second impurity region is provided so as to have p-type conductivity, and alternatively, in a case where the first impurity region is provided so as to have p-type conductivity, the second impurity region is provided to have n-type conductivity.

As described above, the second impurity region 103c having conductivity different from that of the first impurity region 103b is provided so as to be adjacent to a channel forming region in the edge portion of the semiconductor film which overlaps with the conductive film 105, whereby resistance of a portion adjacent to the first impurity region 103b and the second impurity region 103c becomes high by a pn junction. As a result, it becomes possible to reduce the effect of an electrical characteristic of the channel forming region formed in the edge portion of the semiconductor film which overlaps with the conductive film 105, on an electrical characteristic of a transistor.

Figure 18A:
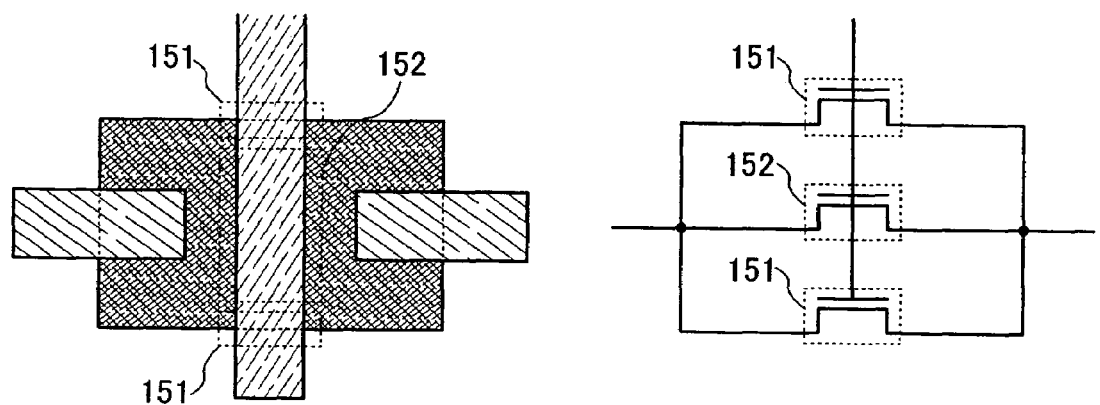
FIGS. 18A and 18B are views showing one example of an equivalent circuit of a semiconductor device of the present invention.

In a conventional thin film transistor, in the edge portion of a semiconductor film which overlaps with a conductive film 105, due to the accumulation of some kind of an electric charge accompanied with a coverage defect of a gate insulating film or a manufacturing process, it can be considered that a transistor 151 in which the edge portion of a semiconductor film 103 is to be a channel forming region (hereinafter, also referred to as "an edge transistor 151") and a transistor 152 in which the central portion of the semiconductor film 103 is to be a channel forming region (hereinafter, referred to as "a main transistor 152") are connected in parallel. Therefore, an equivalent circuit thereof is shown in FIG. 18A, leading to a problem that characteristic of the entire transistors (the edge transistor 151 and the main transistor 152) are affected by not only a characteristic of the main transistor 152 but also a characteristic of the edge transistor 151.

Figure 18B:
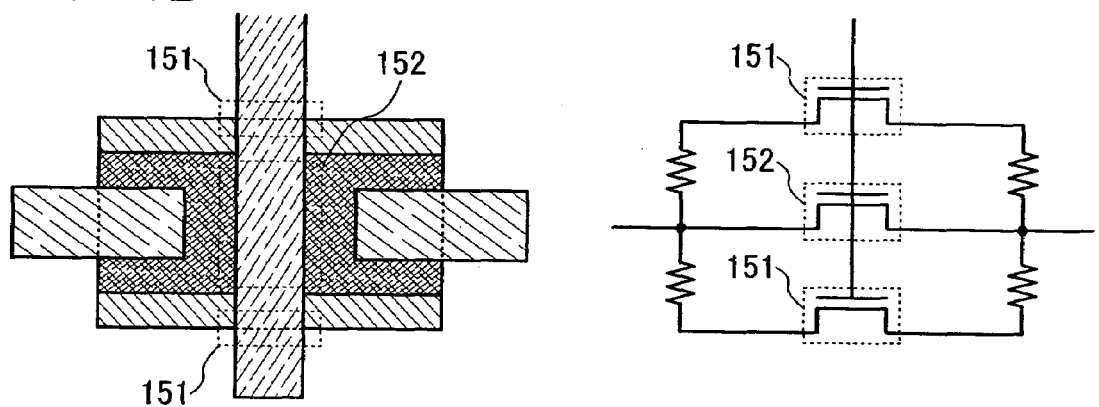

On the other hand, although the structure described in this embodiment mode can also be considered as a structure in which a main transistor 152 and an edge transistor 151 are connected in parallel, an equivalent circuit thereof is as shown in FIG. 18B by the second impurity region 103c being provided. Since resistance between the first impurity region 103b and the second impurity region 103c becomes high, it is possible to reduce the effect of a characteristic of the edge transistor 151 on a characteristic of the entire transistors.

In the above structure, the second impurity region 103c and the channel forming region 103a may be provided so as to have different conductivity. In this case, resistance of a portion in which the channel forming region 103a in the edge portion of the semiconductor film which overlaps with the conductive film 105 is adjacent to the second impurity region 103c becomes high by a pn junction, whereby it is possible to reduce the effect of a characteristic of the edge transistor 151 on a characteristic of the entire transistors.

Figure 12A:
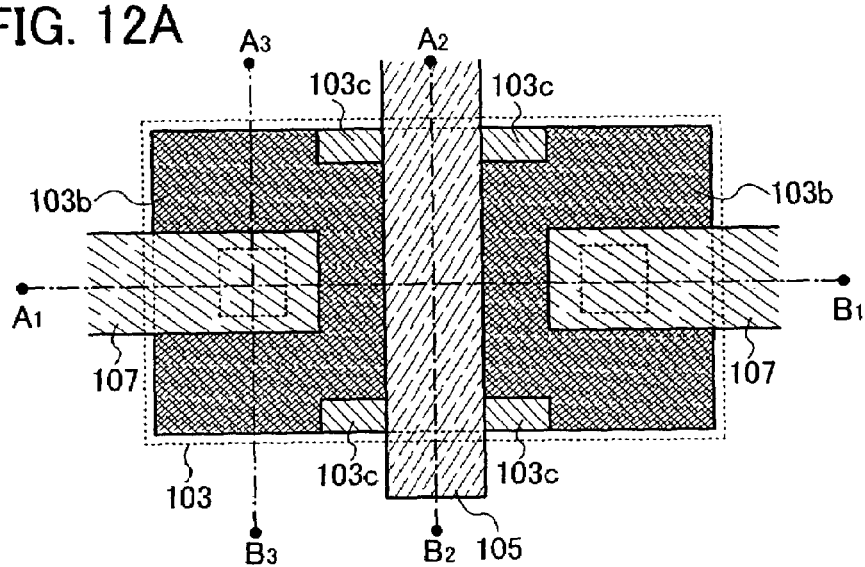
FIGS. 12A to 12C are views showing one example of a semiconductor device of the present invention.
Figure 12B:
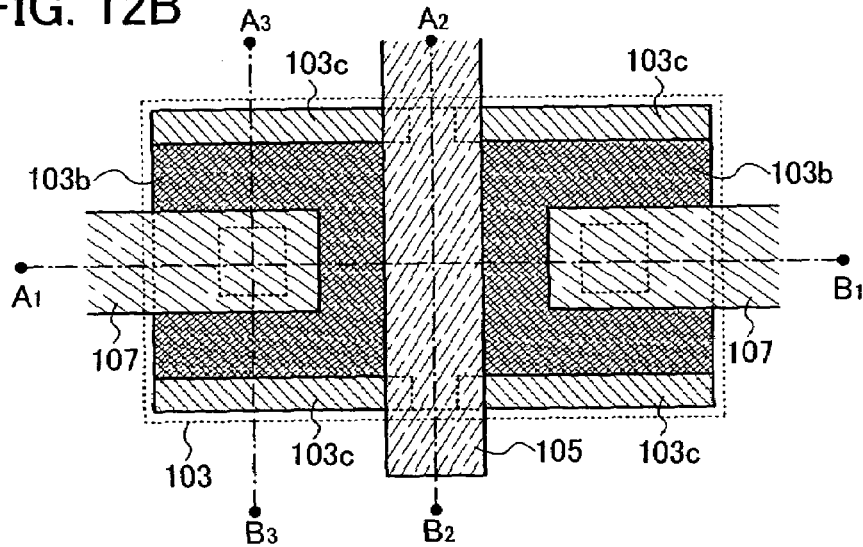

The second impurity region 103c may be provided so as to be adjacent to the channel forming region 103a provided in the edge portion of the island-like semiconductor film 103. In FIGS. 1A to 1D, the second impurity region 103c is formed in all regions not overlapping with the conductive film 105, in an edge portion of the rectangular semiconductor film 103 on the side which overlaps with the conductive film 105 (both edge portions parallel to the line $A_1$-$B_1$ in FIG. 1A). However, the present invention is not limited thereto. For example, the second impurity region 103c, which is in the edge portion of the semiconductor film 103, may be selectively formed in vicinity of a region which overlaps with the conductive film 105 (FIG. 12A). Here, a structure is employed, where the second impurity region 103c, which is in the edge portion of the semiconductor film 103, is provided so as to be adjacent to the region which overlaps with the conductive film 105. Alternatively, the second impurity region 103c may be formed in a region which does not overlap with the conductive film 105 and a region which overlaps therewith (FIG. 12B).

Next, one example of a manufacturing method of the semiconductor device shown in FIGS. 1A to 1D described above will be explained with reference to the drawings. FIGS. 2A to 2E are cross-sectional views taken along a line $A_1$-$B_1$ in FIG. 1A, and FIGS. 3A to 3E are cross-sectional views taken along a line $A_3$-$B_3$ in FIG. 1A.

Figure 2A:
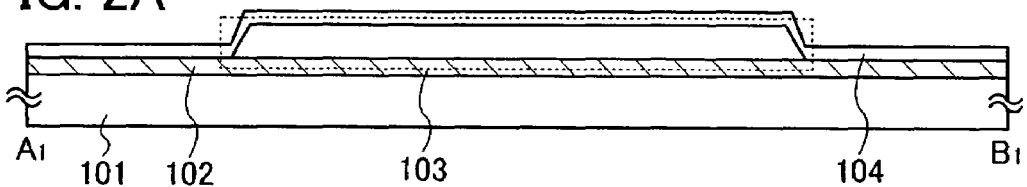
FIGS. 2A to 2E are views showing one example of a manufacturing method of a semiconductor device of the present invention.
Figure 3A:
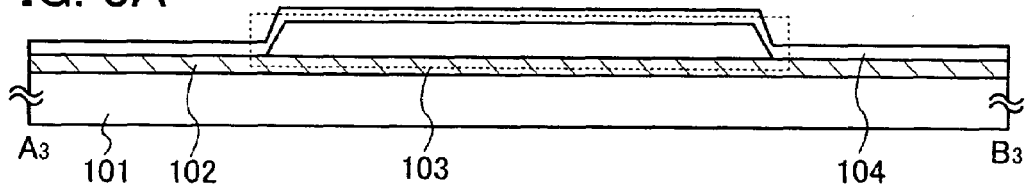
FIGS. 3A to 3E are views showing one example of a manufacturing method of a semiconductor device of the present invention.

First, the island-like semiconductor film 103 is formed over the substrate 101 with an insulating film 102 interposed therebetween, and the gate insulating film 104 is formed so as to cover the island-like semiconductor film 103 (FIGS. 2A and 3A).

The substrate 101 is selected from a glass substrate, a quartz substrate, a metal substrate (e.g., a ceramic substrate or a stainless steel substrate), and a semiconductor substrate such as a Si substrate. Alternatively, the substrate 101 may be a plastic substrate made of polyethylene terephthalate (PET), polyethylene naphthalate (PEN), polyethersulfone (PES), a substrate made of acrylic, or the like. Further, an SOI substrate (Silicon On Insulator) substrate may be used.

The insulating film 102 is formed by a CVD method or a sputtering method, using an insulating material such as silicon oxide, silicon nitride, silicon oxynitride (SiOxNy), (x>y>0), or silicon nitride oxide (SiNxOy) (x>y>0). For example, when the insulating film 102 is formed to have a two-layer structure, it is preferable to form a silicon nitride oxide film as a first-layer insulating film, and form a silicon oxynitride film as a second-layer insulating film. Alternatively, a silicon nitride film may be formed as a first-layer insulating film and a silicon oxide film may be formed as a second-layer insulating film. In this manner, formation of the insulating film 102 serving as a blocking layer can prevent adverse effects of alkaline metals such as Na or alkaline earth metals contained in the substrate 101 to elements formed over the substrate. In a case where quartz is used for the substrate 101, the insulating film 102 may be omitted.

The semiconductor film 103 is formed using an amorphous semiconductor film or a crystalline semiconductor film. The crystalline semiconductor film includes a film which is obtained by an amorphous semiconductor film formed over the insulating film 102, which is crystallized by thermal treatment or laser light irradiation; a film which is obtained by a crystalline semiconductor film formed over the insulating film 102, which is recrystallized after being made amorphous; and the like. Further, an island-like single crystalline semiconductor film may be provided using an SOI (Silicon On Insulator) substrate.

In the case of conducting crystallization or recrystallization by laser light irradiation, an LD-pumped continuous wave (CW) laser (e.g., $YVO_4$ with a second harmonic (wavelength of 532 nm)) can be used as a laser light source. Although the wavelength is not specifically limited to the second harmonic, the second harmonic is superior to harmonics higher than that in terms of energy efficiency. When a semiconductor film is irradiated with CW laser, continuous energy can be given to the semiconductor film. Therefore, once the semiconductor film is made into a molten state, the molten state can be retained. Further, by scanning the semiconductor film with CW laser, a solid-liquid interface of the semiconductor film can be moved, and crystal grains which are long in one direction can be formed along the moving direction. The reason for using a solid-state laser is to obtain more stable output than by using a gas laser or the like, and thus more stable treatment can be expected. It is to be noted that the laser light source is not limited to a CW laser, and a pulsed laser with a repetition rate of 10 MHz or higher can be used as well. When a pulsed laser with a high repetition rate is used, a semiconductor film can be constantly retained in the molten state on the condition that a pulse interval of laser is shorter than a time interval from the point when a semiconductor film is melted until the point when the semiconductor film becomes solidified. Thus, a semiconductor film with crystal grains which are long in one direction can be formed by moving the solid-liquid interface. It is also possible to employ other types of CW lasers or pulsed lasers with a repetition rate of 10 MHz or higher. For example, gas lasers such as an Ar laser, a Kr laser, and a $CO_2$ laser can be used, or solid-state lasers such as a YAG laser, a YLF laser, a $YAlO_3$ laser, a $GdVO_4$ laser, a KGW laser, a KYW laser, an alexandrite laser, a Ti:sapphire laser, a $Y_2O_3$ laser, and a $YVO_4$ laser can be used. In addition, ceramic lasers such as a YAG laser, a $Y_2O_3$ laser, a $GdVO_4$ laser, and a $YVO_4$ laser can also be used. As a metal vapor laser, helium-cadmium laser and the like can be given as examples. Laser lights are preferably emitted from a laser oscillator with $TEM_{00}$ (single transverse mode), which can increase the energy uniformity of a linear beam spot that is obtained on the irradiation surface. Besides, a pulsed excimer laser can also be used.

The gate insulating film 104 is formed using silicon oxide, silicon nitride, silicon oxynitride (SiOxNy) (x>y>0), silicon nitride oxide (SiNxOy) (x>y>0), or the like. Such an insulating layer is formed by a vapor growth method or a sputtering method. Alternatively, the gate insulating film 104 can be formed by high-density plasma treatment such as oxidation treatment or nitridation treatment performed to the surface of the semiconductor film 103 under an atmosphere containing oxygen (e.g., an atmosphere containing oxygen ($O_2$) and rare gas (containing at least one of He, Ne, Ar, Kr, and Xe), or an atmosphere containing oxygen, hydrogen ($H_2$), and rare gas); or an atmosphere containing nitrogen (e.g., an atmosphere containing nitrogen ($N_2$) and rare gas (containing at least one of He, Ne, Ar, Kr, and Xe), an atmosphere containing nitrogen, hydrogen, and rare gas, or an atmosphere containing $NH_3$ and rare gas).

The high-density plasma treatment is performed at an electron density of greater than or equal to $1\times10^{11}$ cm$^{-3}$ and an electron temperature of plasma of less than or equal to 1.5 eV in the atmosphere containing the gases described above. More specifically, the electron density is greater than or equal to $1\times10^{11}$ cm$^{-3}$ and less than or equal to $1\times10^{13}$ cm$^{-3}$, and the electron temperature of plasma is greater than or equal to 0.5 eV and less than or equal to 1.5 eV. The electron density of plasma is high and the electron temperature around an object to be treated (here, the semiconductor film 103) formed over the substrate 101 is low; therefore, the object to be treated can be prevented from being damaged due to plasma. In addition, because of the electron density of plasma as high as $1\times10^{11}$ cm$^{-3}$ or more, the oxide film or the nitride film formed by oxidizing or nitriding of the object to be treated by the plasma treatment has superior uniformity of a film thickness or the like as compared with a film formed by a CVD method, a sputtering method, or the like, and a dense film can be formed. In addition, since the electron temperature of plasma is as low as 1.5 eV or less, the oxidation or nitridation treatment can be performed at a lower temperature than conventional plasma treatment or thermal oxidation method. For example, the oxidation or nitridation treatment can be performed sufficiently even when the plasma treatment is performed at a temperature lower by at least 100° C. than a strain point of a glass substrate. As the frequency for producing plasma, high frequency waves such as microwaves (2.45 GHz) can be used. By oxidizing or nitriding of the surface of the semiconductor film 103 by the high-density plasma treatment to form the gate insulating film 104, defect level density which will trap electrons or holes can be reduced. Further, also in the edge portion of the semiconductor film 103, disconnection or the like of the gate insulating film 104 can be reduced.

Further, in order to control a threshold value or the like, an impurity element may be introduced into the semiconductor film 103 at low concentration in advance. In this case, an impurity element is to be introduced into a region which is to later be a channel forming region in the semiconductor film 103. As the impurity element, an impurity element imparting n-type conductivity or an impurity element imparting p-type conductivity can be used. As the impurity element imparting n-type conductivity, phosphorus (P), arsenic (As), or the like can be used. As the impurity element imparting p-type conductivity, boron (B), aluminum (Al), gallium (Ga), or the like can be used. Here, as the impurity element, boron (B) is introduced into the entire surface of the semiconductor film 103 in advance so as to be contained at a concentration of $5 \times 10^{15}/cm^3$ to $5 \times 10^{17}/cm^3$.

Figure 2B:
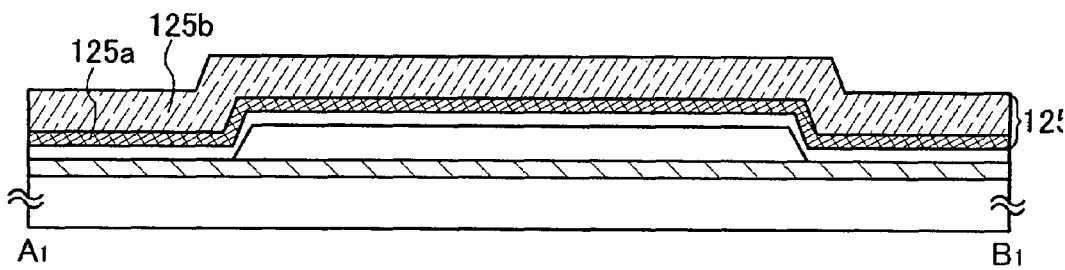
Figure 3B:
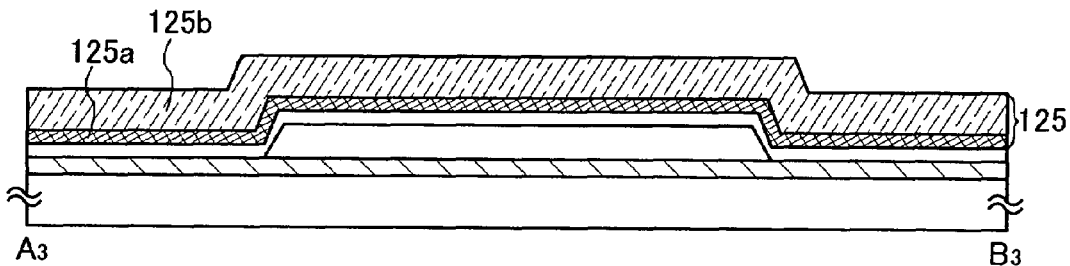

Then, a conductive film 125 is formed over the gate insulating film 104. Here, an example is shown, in which a first conductive film 125a and a second conductive film 125b are formed to be stacked as the conductive film 125 (FIGS. 2B and 3B). Of course, the conductive film 125 may be formed to have a single-layer or a stacked structure of three or more layers.

The conductive film 125 can be formed using an element selected from tantalum (Ta), tungsten (W), titanium (Ti), molybdenum (Mo), aluminum (Al), copper (Cu), chromium (Cr), niobium (Nb), and the like; or an alloy material or a compound material containing the element as a main component. Alternatively, the conductive film 125 can be formed using a semiconductor material typified by polycrystalline silicon doped with an impurity element such as phosphorus. For example, as the conductive film 125, a stacked structure of the first conductive film 125a and the second conductive film 125b is provided, in which tantalum nitride is used as the first conductive film 125a and tungsten is used as the second conductive film 125b. In a case where the conductive film 125 is formed to have a stacked structure, the materials described above can be freely combined to provide the conductive film 125.

Figure 2C:
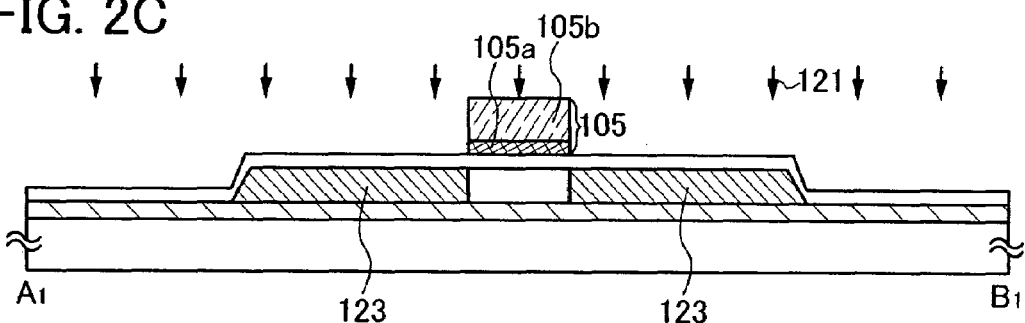
Figure 3C:
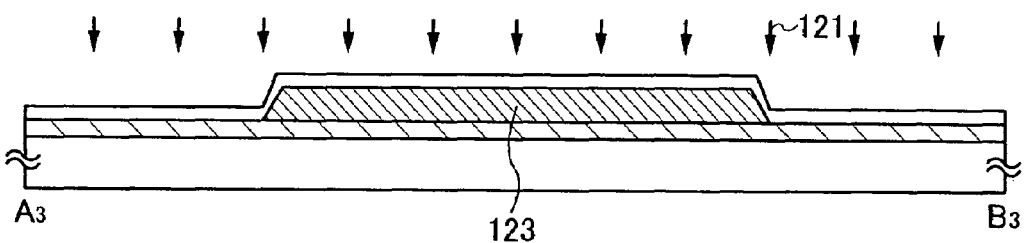

Then, the conductive film 125 (here, a stacked structure of the first conductive film 125a and the second conductive film 125b) is selectively etched to form the conductive film 105 (here, a stacked structure of the conductive film 105a and the conductive film 105b) serving as a gate electrode, and then, an impurity element 121 is introduced into the semiconductor film 103 with the conductive film 105 being used as a mask, thereby forming an impurity region 123 in the semiconductor film 103 (FIGS. 2C and 3C). Here, an impurity element is introduced after the conductive film 105 is formed so as to cross the island-like semiconductor film 103; therefore, the impurity region 123 is formed in a region of the semiconductor film 103 which does not overlap with the conductive film 105.

As the impurity element 121, an impurity element imparting n-type conductivity or an impurity element imparting p-type conductivity can be used. As the impurity element imparting n-type conductivity, phosphorus (P), arsenic (As), or the like can be used. As the impurity element imparting p-type conductivity, boron (B), aluminum (Al), gallium (Ga), or the like can be used. Here, as the impurity element 121, phosphorus (P) is introduced into the semiconductor film 103 so as to be contained at a concentration of $1 \times 10^{15}/cm^3$ to $1 \times 10^{19}/cm^3$, whereby the impurity region 123 having n-type conductivity is formed.

Figure 2D:
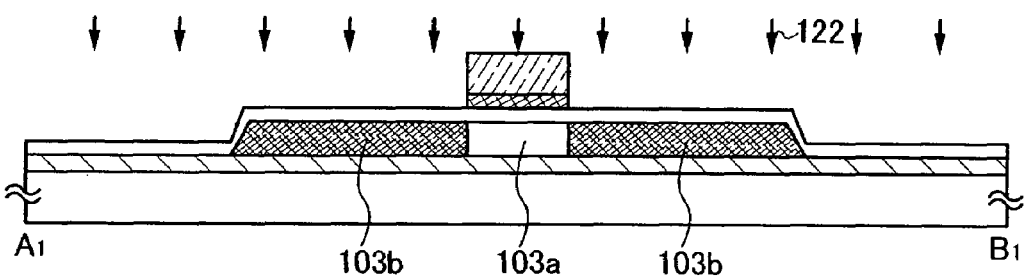
Figure 3D:
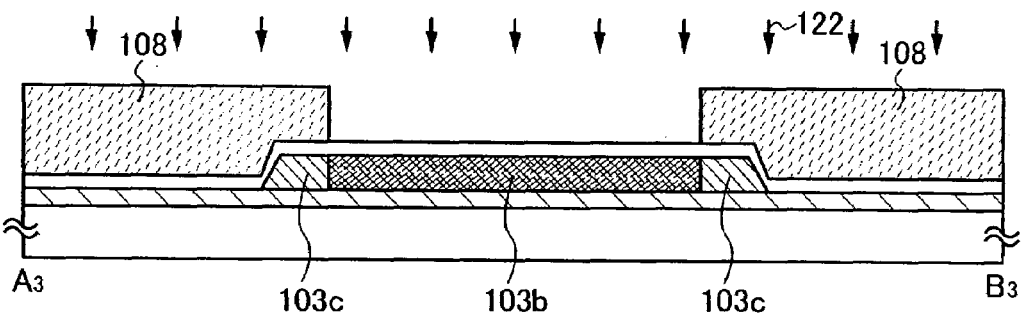

Next, after part of the edge portion of the island-like semiconductor film 103 is selectively provided with a resist 108, an impurity element 122 is introduced into the semiconductor film 103 with the resist 108 and the conductive film 105 being used as masks, thereby forming the channel forming region 103a, the first impurity region 103b, and the second impurity region 103c in the semiconductor film (FIGS. 2D and 3D). As a result, a thin film transistor is formed.

The channel forming region 103a is formed in a region of the semiconductor film 103 which overlaps with the conductive film 105 forming a gate electrode. The first impurity region 103b serving as a source region or drain region is formed so as to be adjacent to the channel forming region 103a. The second impurity region 103c, which is in the edge portion of the semiconductor film 103, is formed so as to be adjacent to the channel forming region 103a and the first impurity region 103b. Here, a portion into which the impurity element 122 is not introduced becomes the second impurity region 103c.

Specifically, the second impurity region 103c is formed in both edge portions of the semiconductor film 103 which overlap with the conductive film 105 crossing the semiconductor film 103. The first impurity region 103b is formed so as to be adjacent to a region between the second impurity regions 103c formed in the both edge portions. It is not necessary that the second impurity region 103c be formed in all edge portions of the semiconductor film 103, and as shown in FIG. 12A described above, the second impurity region 103c can be provided in part of the edge portion so as to be in contact with the channel forming region 103a and the first impurity region 103b. In this case, the resist 108 is selectively formed, and a position where the impurity element 122 is to be implanted into the semiconductor film 103 is controlled, whereby the second impurity region 103c can be formed into a desired shape.

As the impurity element 122, an impurity element imparting n-type conductivity or an impurity element imparting p-type conductivity can be used. As the impurity element imparting n-type conductivity, phosphorus (P), arsenic (As), or the like can be used. As the impurity element imparting p-type conductivity, boron (B), aluminum (Al), gallium (Ga), or the like can be used. In this embodiment mode, as the impurity element 122, an impurity element having conductivity different from that of the impurity element 121 is used. Here, as the impurity element 122, boron (B) is introduced into the semiconductor film 103 so as to be contained at a concentration of $1 \times 10^{19}/cm^3$ to $1 \times 10^{20}/cm^3$, whereby the impurity region 103b having p-type conductivity is formed.

Figure 2E:
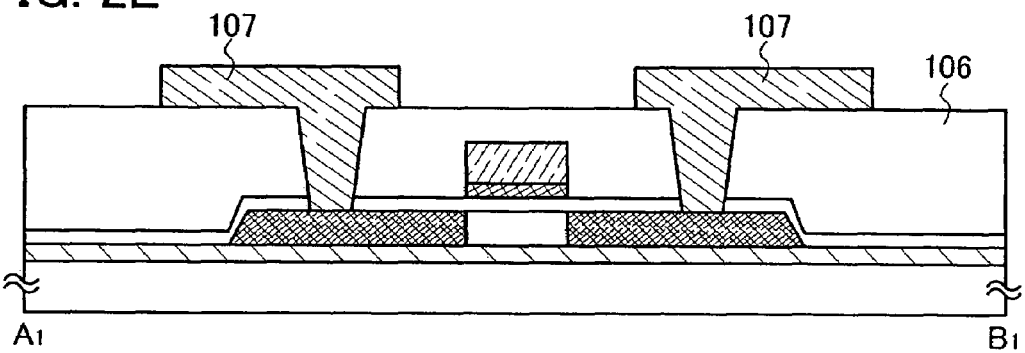
Figure 3E:
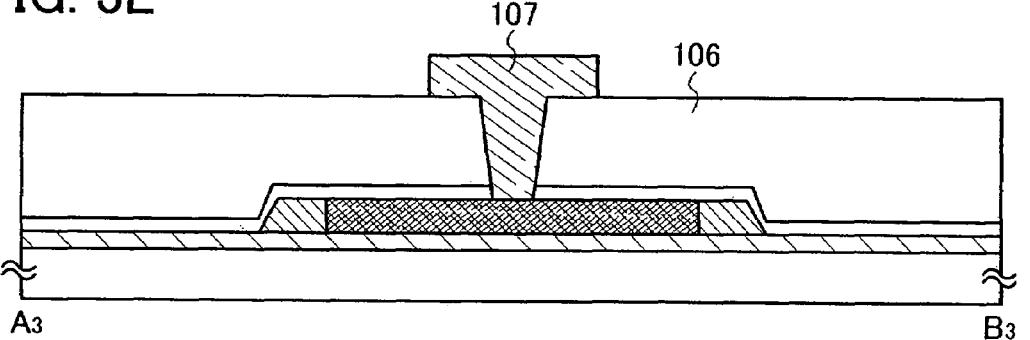

Then, the insulating film 106 is formed so as to cover the conductive film 105, the gate insulating film 104, and the like, and the conductive film 107 serving as a source electrode or drain electrode is selectively formed over the insulating film 106 (FIGS. 2E and 3E). The conductive film 107 is provided so as to be electrically connected to the first impurity region 103b forming a source region or drain region of the semiconductor film 103.

The insulating film 106 is formed by a CVD method, a sputtering method, or the like using silicon oxide, silicon oxynitride (SiOxNy) (x>y>0), silicon nitride oxide (SiNxOy) (x>y>0), or the like. Alternatively, the insulating film 106 can be formed to have a single-layer structure or a stacked structure including an organic material such as polyimide, polyamide, polyvinyl phenol, benzocyclobutene, acrylic, or epoxy; a siloxane material such as a siloxane resin; an oxazole resin; and the like. It is to be noted that a siloxane material corresponds to a material including a Si—O—Si bond. Siloxane is a material having a skeletal structure with the bond of silicon (Si) and oxygen (O). As a substituent, an organic group containing at least hydrogen (e.g., an alkyl group or aromatic hydrocarbon) is used. Alternatively, a fluoro group can be used as the substituent, or both a fluoro group and an organic group containing at least hydrogen can be used as the substituent. An oxazole resin includes, for example, photosensitive polybenzoxazole or the like. Photosensitive polybenzoxazole is a material having a low dielectric constant (dielectric constant of 2.9 at 1 MHz at room temperature), high heat resistance (thermal decomposition temperature of 550° C. with a temperature rise of 5° C./min by TGA (Thermal Gravity Analysis)), and a low water absorbing rate (0.3% at room temperature for 24 hours). An oxazole resin has a lower dielectric constant (approximately 2.9) as compared with a relative dielectric constant of polyimide or the like (approximately 3.2 to 3.4). Therefore, generation of parasitic capacitance can be suppressed and high-speed operation can be performed. Here, as the insulating film 106, silicon oxide, silicon oxynitride (SiOxNy) (x>y>0), or silicon nitride oxide (SiNxOy) (x>y>0) formed by a CVD method is formed as a single-layer structure or a stacked structure. Further, the insulating film 106 may be formed as a stacked layer of an organic material such as polyimide, polyamide, polyvinyl phenol, benzocyclobutene, acrylic, or epoxy; a siloxane material such as a siloxane resin; or an oxazole resin.

The conductive film 107 can be formed to have a single-layer structure or a stacked structure using one kind of metal selected from aluminum, tungsten, titanium, tantalum, molybdenum, nickel, neodymium, and the like; or an alloy containing a plurality of the elements. For example, as a conductive film formed using an alloy containing a plurality of the elements, an aluminum alloy containing titanium, an aluminum alloy containing neodymium, or the like can be used. In a case where the conductive film 107 is provided so as to have a stacked structure, for example, a structure in which an aluminum layer or an aluminum alloy layer as described in the above is stacked by being interposed between titanium layers may be employed.

Through the above steps, a semiconductor device can be manufactured.

Figure 12C:
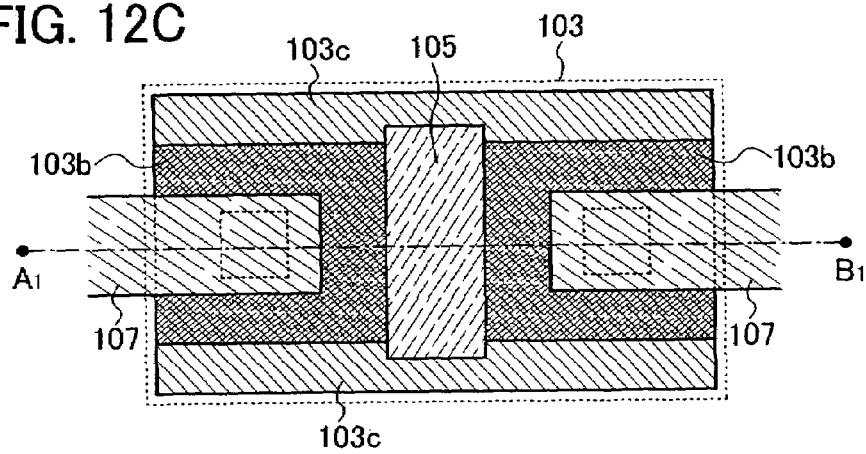

In this embodiment mode, a case is shown, where the conductive film 105 forming a gate electrode crosses the semiconductor film 103 so as to cover the edge portion of the semiconductor film 103. However, a structure may be employed, in which the conductive film 105 crosses the semiconductor film 103 and is provided over the semiconductor film 103, so as not to cover the edge portion of the semiconductor film 103 (FIG. 12C). In this case, the channel forming region 103a is formed in the semiconductor film 103 which overlaps with the conductive film 105, the first impurity region 103b forming a source region or drain region is formed so as to be adjacent to the channel forming region 103a, and the second impurity region 103c is formed so as to be adjacent to the channel forming region 103a and the first impurity region 103b. The second impurity region 103c is provided in the edge portion of the semiconductor film 103 so that the first impurity region 103b is interposed between the second impurity regions 103c. The second impurity region 103c and the channel forming region 103a may be provided to have different conductivity each other.

As described in this embodiment mode, in the edge portion of the semiconductor film, even when a fixed charge due to a coverage defect of a gate insulating film or a process is formed, the effect of an edge transistor can be reduced by an impurity region having different conductivity so as to be adjacent to a source region or drain region.

Embodiment Mode 2

In this embodiment mode, a semiconductor device and a manufacturing method thereof, which are different from the above embodiment mode, will be explained with reference to the drawings. Specifically, a case where a plurality of transistors where some transistors have n-type and the other transistors have p-type are included will be explained.

Figure 4A:
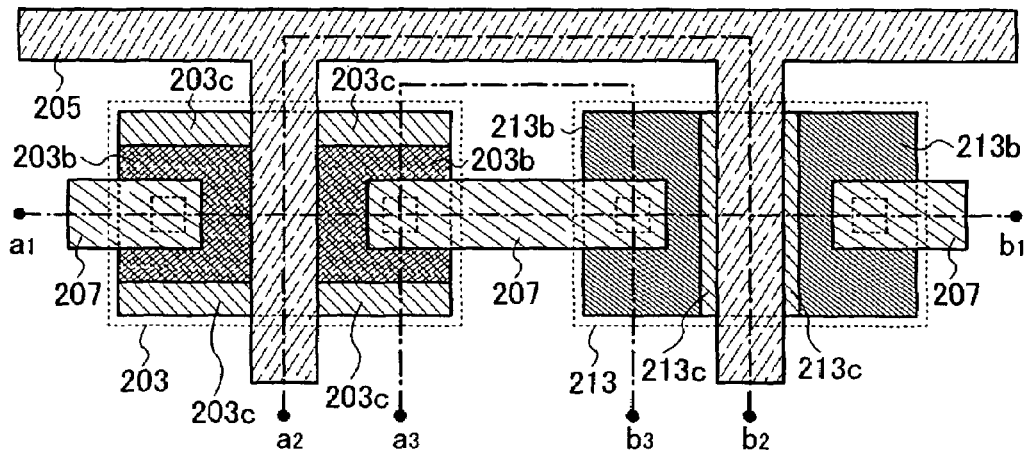
FIGS. 4A to 4D are views of one example of a semiconductor device of the present invention.
Figure 4B:
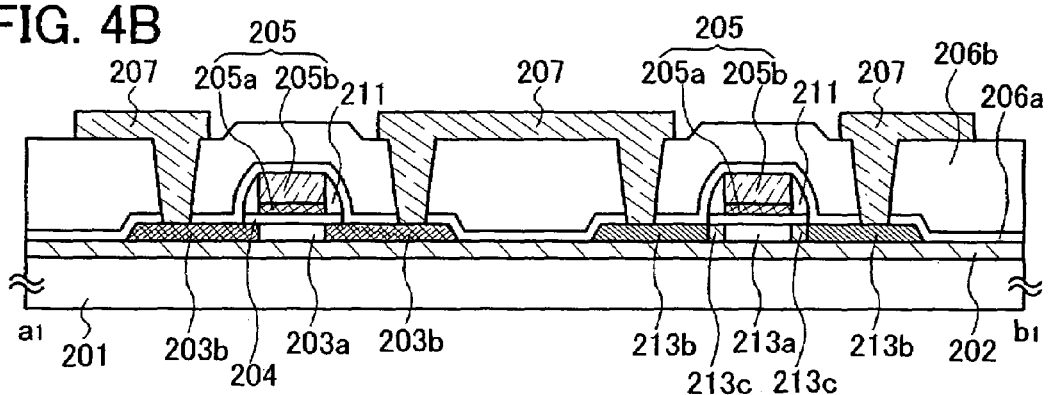
Figure 4C:
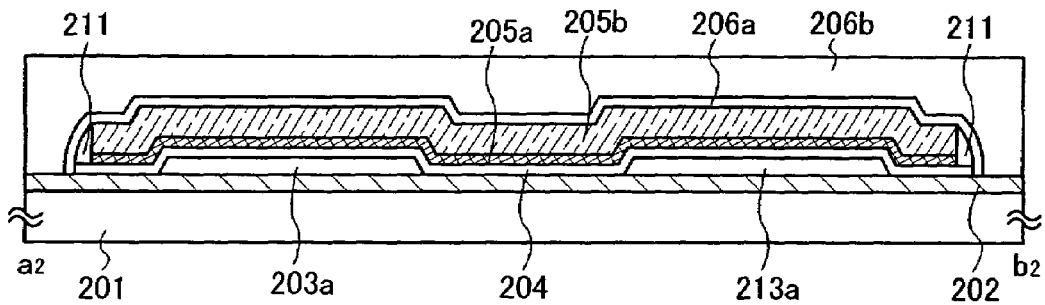
Figure 4D:
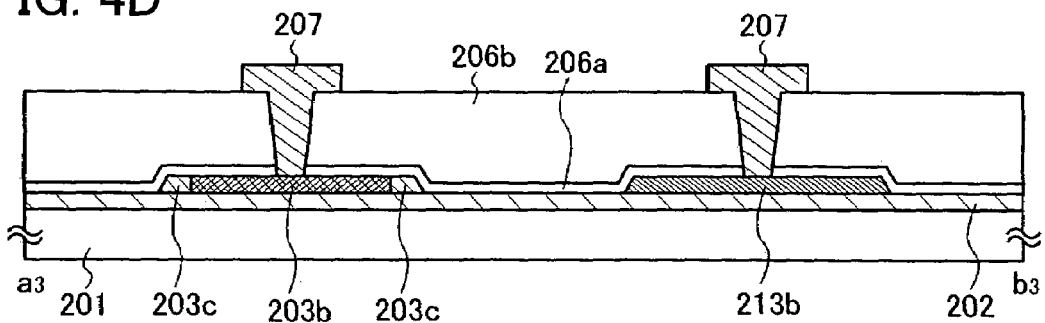

FIGS. 4A to 4D show a semiconductor device to be described in this embodiment mode. FIG. 4A is a top view of a semiconductor device to be described in this embodiment mode, FIG. 4B is a cross-sectional view taken along a line $a_1$-$b_1$ in FIG. 4A, FIG. 4C is a cross-sectional view taken along a line $a_2$-$b_2$ in FIG. 4A, and FIG. 4D is a cross-sectional view taken along a line $a_3$-$b_3$ in FIG. 4A.

A semiconductor device described in this embodiment mode has semiconductor films 203 and 213 each provided in an island-like shape over a substrate 201 with an insulating film 202 interposed between the substrate 201 and the semiconductor films 203 and 213; a conductive film 205 forming a gate electrode provided above the semiconductor films 203 and 213 with a gate insulating film 204 interposed between the conductive film 205 and the semiconductor films 203 and 213; insulating films 206a and 206b provided above the semiconductor films 203 and 213 so as to cover the conductive film 205; and a conductive film 207 forming a source electrode or drain electrode provided over the insulating film 206 (FIGS. 4A to 4D).

The conductive film 205 forming the gate electrode is provided so as to cross the island-like semiconductor films 203 and 213. Further, an insulating film 211 (also referred to as a sidewall) is provided so as to be in contact with the side face of the conductive film 205. Here, a case where the conductive film 205 is provided so as to have a structure in which a first conductive film 205a and a second conductive film 205b are stacked is shown; however, the present invention is not limited thereto, and the conductive film 205 may have a single-layer structure or a structure in which three or more layers are stacked.

The semiconductor film 203 provided in an island-like shape has a channel forming region 203a provided in a region which overlaps with the conductive film 205 with the gate insulating film 204 interposed between the conductive film 205 and the channel forming region 203a; a first impurity region 203b forming a source region or drain region provided so as to be adjacent to the channel forming region 203a, in a region which does not overlap with the conductive film 205; and a second impurity region 203c provided so as to be adjacent to the channel forming region 203a and the first impurity region 203b, in a region which does not overlap with the conductive film 205.

The semiconductor film 213 provided in an island-like shape has a channel forming region 213a provided in a region which overlaps with the conductive film 205 with the gate insulating film 204 interposed between the conductive film 205 and the channel forming region 213a; a fourth impurity region 213c provided so as to be adjacent to the channel forming region 213a, in a region which does not overlap with the conductive film 205; and a third impurity region 213b forming a source region or drain region provided so as to be adjacent to the fourth impurity region 213c, in a region which does not overlap with the conductive film 205.

The fourth impurity region 213c forms an LDD region. The fourth impurity region 213c is provided between the channel forming region 213a and the third impurity region 213b and is formed below the insulating film 211 which is provided so as to be in contact with the side face of the conductive film 205.

When the conductive film 205 is provided so as to have a stacked structure of a first conductive film 205a and a second conductive film 205b, the first conductive film 205a to be formed below can be formed so as to have a width larger than that of the second conductive film 205b to be formed above, and a structure can be obtained in which the fourth impurity region 213c overlaps with the first conductive film 205a but does not overlap with the second conductive film 205b. When such a structure is employed, an ON current characteristic of a transistor can be improved.

In this embodiment mode, the first impurity region 203b to be formed in the semiconductor film 203 is formed as an impurity region having conductivity different from that of the second impurity region 203c. The first impurity region 203b to be formed in the semiconductor film 203 is formed as an impurity region having conductivity different from that of the third impurity region 213b and the fourth impurity region 213c to be formed in the semiconductor film 213.

In other words, the second impurity region 203c to be formed in the semiconductor film 203 and the third impurity region 213b and fourth impurity region 213c to be formed in the semiconductor film 213 have the same conductivity. In this case, the second impurity region 203c and third impurity region 213b or the second impurity region 203c and fourth impurity region 213c may be formed to have the same concentration of an impurity element contained therein. As a result, during a manufacturing process, the second impurity region 203c and third impurity region 213b or the second impurity region 203c and fourth impurity region 213c can be formed to be the same, and accordingly, a process can be simplified.

For example, the first impurity region 203b forming a source region or drain region of the semiconductor film 203 can be provided to have p-type conductivity, the second impurity region 203c can be provided to have n-type conductivity, the third impurity region 213b forming a source or a drain of the semiconductor film 213 can be provided to have n-type conductivity, and the fourth impurity region 213c forming an LDD region can be provided to have n-type conductivity at lower concentration than that of the third impurity region 213b. Further, the second impurity region 203c and the fourth impurity region 213c can be provided so as to have the same concentration. Of course, the second impurity region 203c and the third impurity region 213b can be provided so as to have the same concentration. When the first impurity region 203b to be formed in the semiconductor film 203 is provided to have n-type conductivity, the types of the conductivity of the other regions are reversed.

The conductive film 207 forming a source electrode or drain electrode is provided so as to be electrically connected to the first impurity region 203b forming a source region or drain region of the semiconductor film 203 and the third impurity region 213b forming a source region or drain region of the semiconductor film 213 through an opening portion formed in the insulating films 206a and 206b. Further, as shown in FIGS. 4A to 4D, a CMOS circuit may be formed by electrical connection of the first impurity region 203b and the third impurity region 213b through the conductive film 207.

Next, one example of a manufacturing method of the semiconductor device shown in FIGS. 4A to 4D described above will be explained with reference to the drawings. FIGS. 5A to 5D are top views of FIGS. 6A to 6F, FIGS. 6A to 6F are cross-sectional views taken along a line $a_1$-$b_1$ in FIG. 4A, and FIGS. 7A to 7F are cross-sectional views taken along a line $a_3$-$b_3$ in FIG. 4A.

Figure 6A:
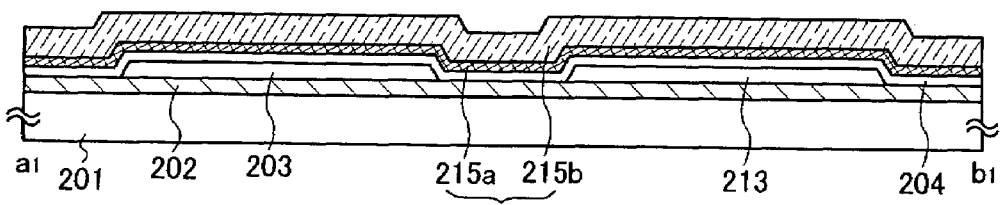
FIGS. 6A to 6F are views showing one example of a manufacturing method of a semiconductor device of the present invention.
Figure 7A:
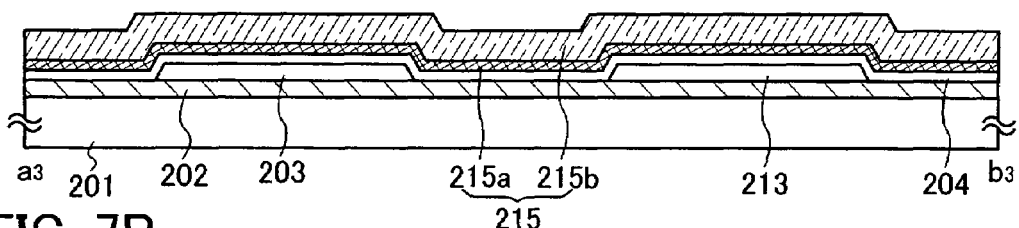
FIGS. 7A to 7F are views showing one example of a manufacturing method of a semiconductor device of the present invention.

First, the island-like semiconductor films 203 and 213 are formed over the substrate 201 with the insulating film 202 interposed between the substrate 201 and the island-like semiconductor films 203 and 213. A gate insulating film 204 and a conductive film 215 are formed to be stacked so as to cover the island-like semiconductor films 203 and 213 (FIGS. 6A and 7A). The manufacturing method, the materials, and the like described in Embodiment Mode 1 can be applied to each of the substrate 201, the insulating film 202, the semiconductor films 203 and 213, the gate insulating film 204, and the conductive film 215 in this embodiment mode. Here, the conductive film 215 is formed to have a stacked structure of a first conductive film 215a and a second conductive film 215b.

Further, in order to control a threshold value or the like, an impurity element may be introduced into the semiconductor films 203 and 213 at low concentration in advance. In this case, an impurity element is to be introduced into a region which is to later be a channel forming region in the semiconductor films 203 and 213. As the impurity element, an impurity element imparting n-type conductivity or an impurity element imparting p-type conductivity can be used. As the impurity element imparting n-type conductivity, phosphorus (P), arsenic (As), or the like can be used. As the impurity element imparting p-type conductivity, boron (B), aluminum (Al), gallium (Ga), or the like can be used. For example, as the impurity element, boron (B) can be introduced into the entire surface of each of the semiconductor films 203 and 213 in advance so as to be contained at a concentration of $5 \times 10^{15}$/cm$^3$ to $5 \times 10^{17}$/cm$^3$. Of course, an impurity element may be introduced into the semiconductor film 203 and the semiconductor film 213 at different concentration, or, alternatively, an impurity element having different conductivity may be introduced.

Figure 5A:
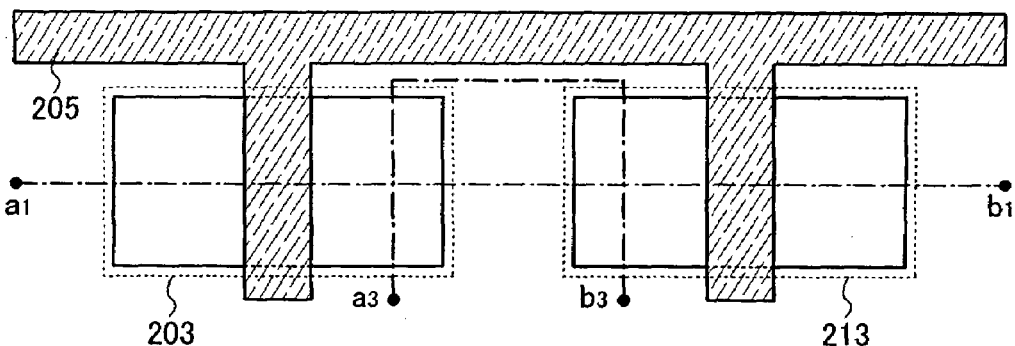
FIGS. 5A to 5D are views showing one example of a manufacturing method of a semiconductor device of the present invention.
Figure 5B:
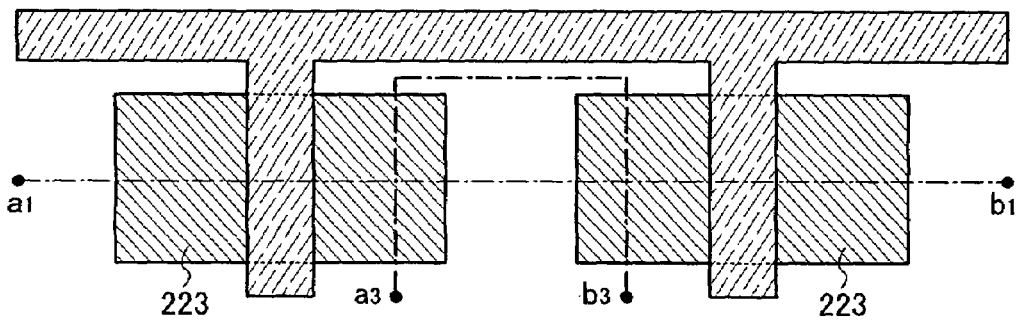
Figure 6B:
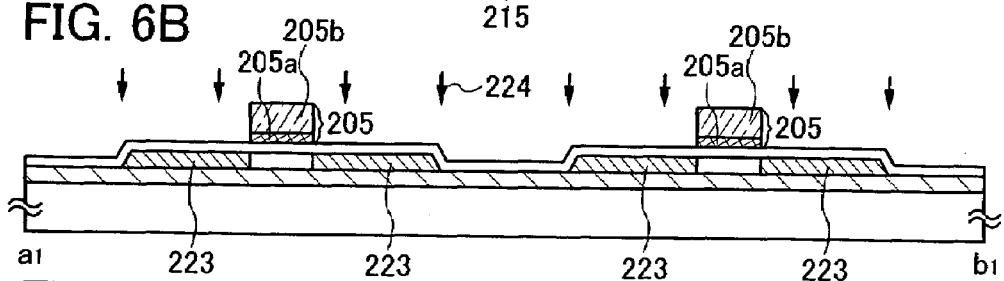
Figure 7B:
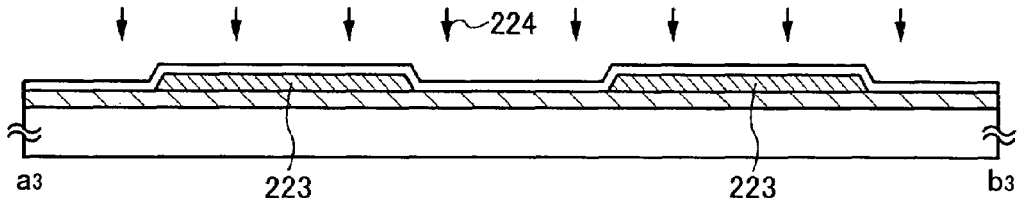

Then, the conductive film 215 (here, a stacked structure of the first conductive film 215a and the second conductive film 215b) is selectively etched to form the conductive film 205 (here, a stacked structure of the conductive film 205a and the conductive film 205b) serving as a gate electrode (FIG. 5A), and then, an impurity element 224 is introduced into the semiconductor films 203 and 213 with the conductive film 205 being used as a mask, thereby forming an impurity region 223 in the semiconductor films 203 and 213 (FIGS. 5B, 6B, and 7B). Here, the impurity element 224 is introduced after the conductive film 205 is formed so as to cross the island-like semiconductor films 203 and 213; therefore, the impurity region 223 is formed in a region of the semiconductor films 203 and 213 which does not overlap with the conductive film 205.

As the impurity element 224, an impurity element imparting n-type conductivity or an impurity element imparting p-type conductivity can be used. As the impurity element imparting n-type conductivity, phosphorus (P), arsenic (As), or the like can be used. As the impurity element imparting p-type conductivity, boron (B), aluminum (Al), gallium (Ga), or the like can be used. Here, as the impurity element 224, phosphorus (P) is introduced into the semiconductor films 203 and 213 so as to be contained at a concentration of $1 \times 10^{15}$/cm$^3$ to $1 \times 10^{19}$/cm$^3$, whereby the impurity region 223 having n-type conductivity is formed.

Figure 5C:
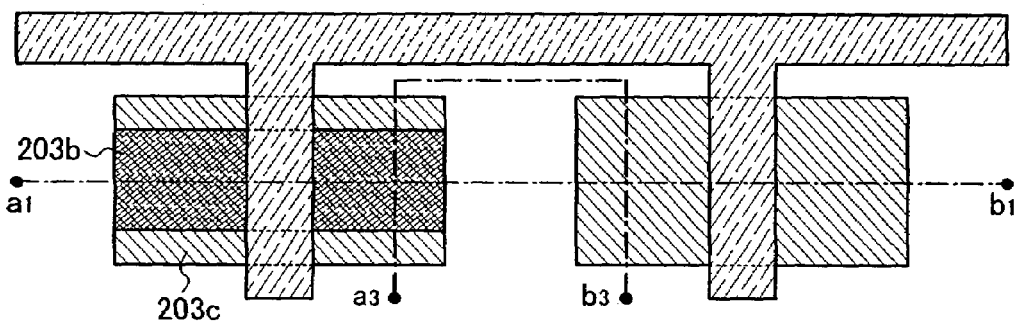
Figure 6C:
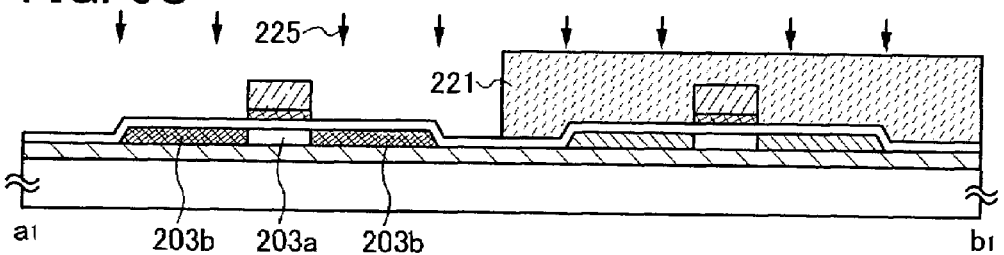
Figure 7C:
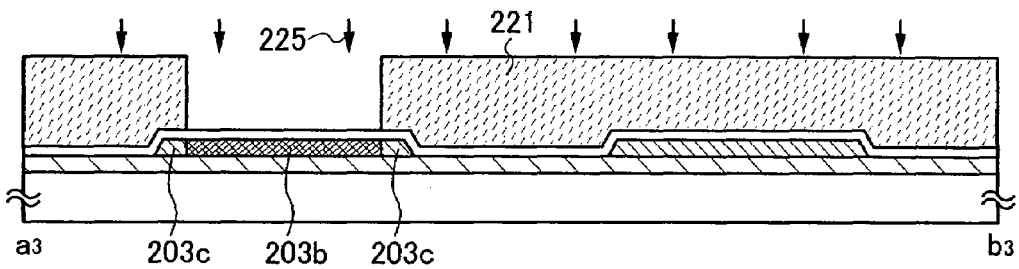

After a resist 221 is selectively provided so as to cover part of the edge portion of the semiconductor film 203 and the entire surface of the semiconductor film 213, an impurity element 225 is introduced into the semiconductor film 203 with the resist 221 and the conductive film 205 formed above the semiconductor film 203 being used as masks, whereby the channel forming region 203a, the first impurity region 203b, and the second impurity region 203c are formed in the semiconductor film 203 (FIGS. 5C, 6C, and 7C). The channel forming region 203a is formed in a region of the semiconductor film 203 which overlaps with the conductive film 205 forming a gate electrode. The first impurity region 203b serving as a source region or drain region is formed so as to be adjacent to the channel forming region 203a. The second impurity region 203c, which is in the edge portion of the semiconductor film 203, is formed so as to be adjacent to the channel forming region 203a and the first impurity region 203b. Here, a portion into which the impurity element 225 is not introduced becomes the second impurity region 203c.

Specifically, the second impurity region 203c is formed in both edge portions of the semiconductor film 203 which overlap with the conductive film 205 crossing the semiconductor film 203. The first impurity region 203b is formed so as to be adjacent to a region between the second impurity regions 203c formed in both edge portions. It is not necessary that the second impurity region 203c be formed in all edge portions of the semiconductor film 203, and as shown in FIG. 12A described above, the second impurity region 203c can be provided in part of the edge portion so as to be in contact with the channel forming region 203a and the first impurity region 203b. In this case, the resist 221 is selectively formed, and the position where the impurity element 225 is to be implanted into the semiconductor film 203 is controlled, whereby the second impurity region 203c can be formed into a desired shape.

As the impurity element 225, an impurity element imparting n-type conductivity or an impurity element imparting p-type conductivity can be used. As the impurity element imparting n-type conductivity, phosphorus (P), arsenic (As), or the like can be used. As the impurity element imparting p-type conductivity, boron (B), aluminum (Al), gallium (Ga), or the like can be used. In this embodiment mode, as the impurity element 225, an impurity element having conductivity different from that of the impurity element 224 is used. Here, as the impurity element 225, boron (B) is introduced into the semiconductor film 203 so as to be contained at a concentration of $1 \times 10^{19}/cm^3$ to $1 \times 10^{20}/cm^3$, whereby the impurity region 203b having p-type conductivity is formed.

Figure 6D:
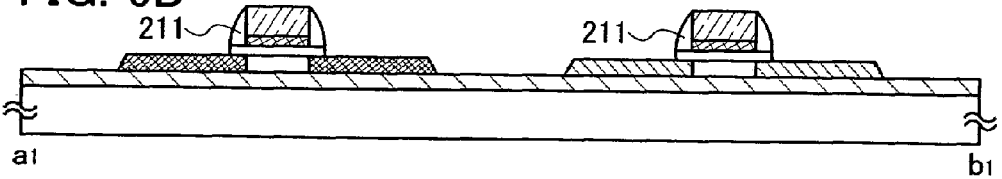
Figure 7D:
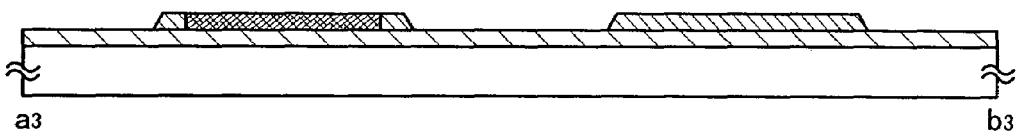

Next, the insulating film 211 is formed so as to be in contact with the side face of the conductive film 205 (FIGS. 6D and 7D). The insulating film 211 is referred to as a sidewall in some cases, and in the subsequent step, the insulating film 211 serves as a mask when a low concentration impurity region is formed below the insulating film 211 by doping of an n-type impurity into the semiconductor film at high concentration.

The insulating film 211 is formed as a single layer or as a stacked layer of a film including an inorganic material of silicon, an oxide of silicon, or a nitride of silicon and a film including an organic material such as an organic resin. The insulating film formed over the entire surface can be selectively etched by anisotropic etching in which etching is performed mainly in a perpendicular direction.

Figure 5D:
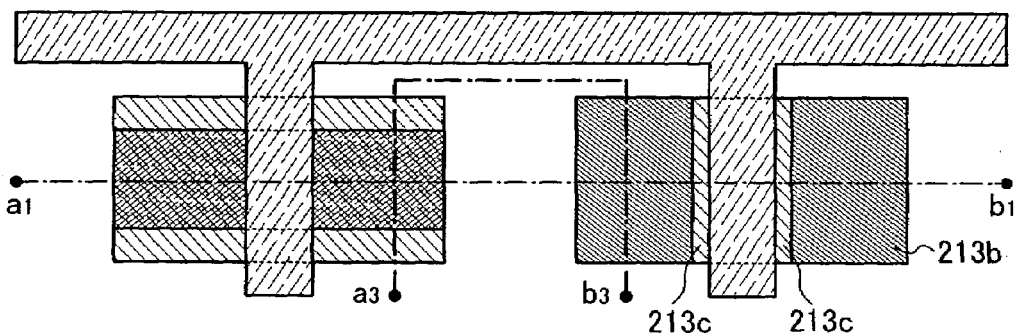
Figure 6E:
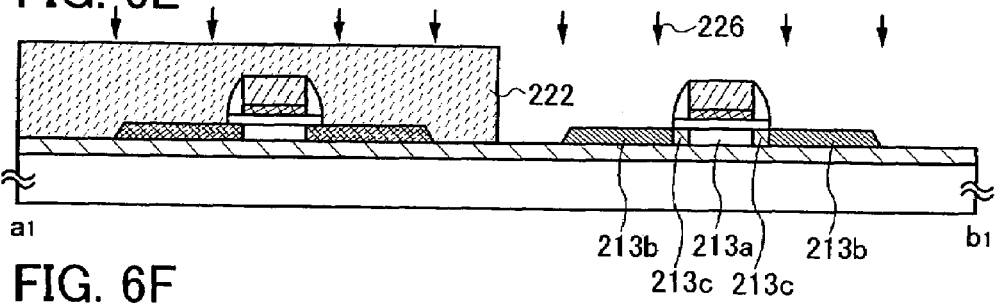
Figure 7E:
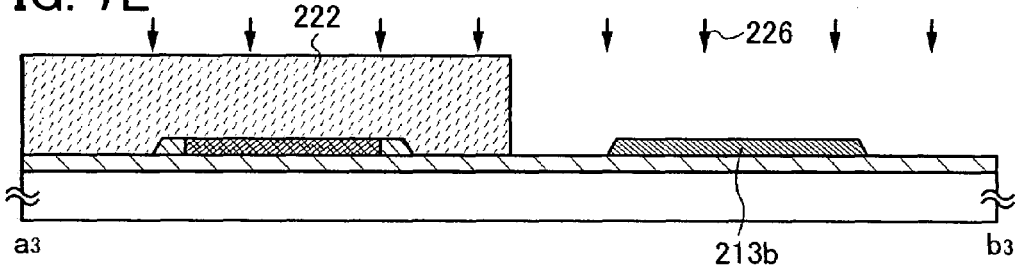

After a resist 222 is selectively provided so as to cover the entire surface of the semiconductor film 203, an impurity element 226 is introduced into the semiconductor film 213 with the conductive film 205 and the insulating film 211 formed above the semiconductor film 213 being used as masks, whereby the channel forming region 213a, the third impurity region 213b, and the fourth impurity region 213c are formed in the semiconductor film 213 (FIGS. 5D, 6E, and 7E). The channel forming region 213a is formed in a region of the semiconductor film 213 which overlaps with the conductive film 205 forming a gate electrode. The fourth impurity region 213c serving as an LDD region is formed in a region of the semiconductor film 213 which is adjacent to the channel forming region 213a and overlaps with the insulating film 211. The third impurity region 213b serving as a source region or drain region is formed so as to be adjacent to the fourth impurity region 213c. Here, a portion into which the impurity element 226 is not introduced becomes the fourth impurity region 213c.

As the impurity element 226, an impurity element imparting n-type conductivity or an impurity element imparting p-type conductivity can be used. As the impurity element imparting n-type conductivity, phosphorus (P), arsenic (As), or the like can be used. As the impurity element imparting p-type conductivity, boron (B), aluminum (Al), gallium (Ga), or the like can be used. In this embodiment mode, as the impurity element 226, an impurity element having conductivity different from that of the impurity element 225 is used. Here, as the impurity element 226, phosphorus (P) is introduced into the semiconductor film 213 so as to be contained at a concentration of $1 \times 10^{19}/cm^3$ to $1 \times 10^{20}/cm^3$, whereby the third impurity region 213b having p-type conductivity is formed.

In this embodiment mode, the order of introduction of the impurity element 225 and the impurity element 226 into the semiconductor films 203 and 213 may be reversed. In this case, the third impurity region 213b and the fourth impurity region 213c are formed in the semiconductor film 213 in advance, and thereafter, the first impurity region 203b and the second impurity region 203c are formed in the semiconductor film 203.

Figure 6F:
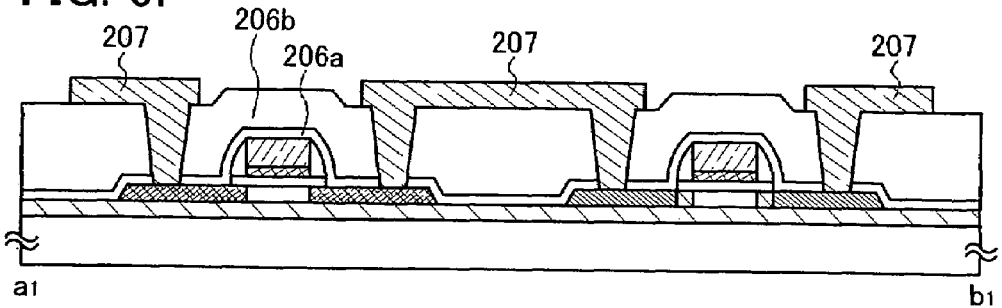
Figure 7F:
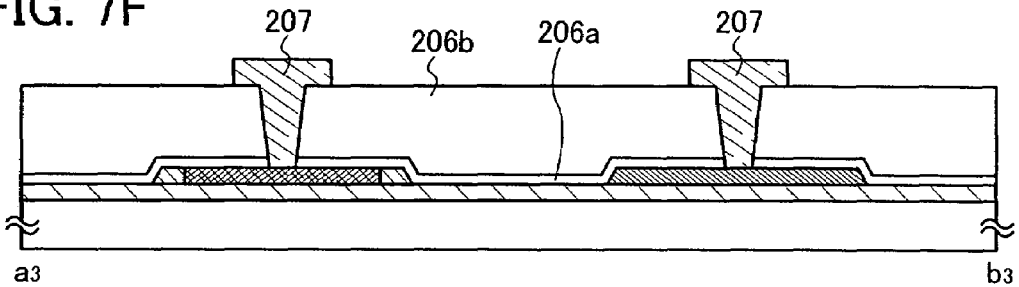

Then, the insulating film 206a and the insulating film 206b are formed to be stacked so as to cover the conductive film 205, the semiconductor films 203 and 213, and the like, and the conductive film 207 serving as a source electrode or drain electrode is selectively formed over the insulating film 206b (FIGS. 6F and 7F). The conductive film 207 is provided so as to be electrically connected to the first impurity region 203b forming a source region or drain region of the semiconductor film 203 and the third impurity region 213b forming a source region or drain region of the semiconductor film 213. Further, in this embodiment mode, a CMOS circuit having a p-channel thin film transistor and an n-channel thin film transistor can be formed by electrical connection of the conductive film 207 which is electrically connected to the first impurity region 203b and the conductive film 207 which is electrically connected to the third impurity region 213b.

The manufacturing method, the materials, and the like described in Embodiment Mode 1 can also be applied to each of the insulating film 206a, the insulating film 206b, and the conductive film 207 in this embodiment mode. Here, as the insulating film 206a, silicon oxide, silicon oxynitride (SiOxNy) (x>y>0), or silicon nitride oxide (SiNxOy) (x>y>0) formed by a CVD method is formed. As the insulating film 206b, an organic material such as polyimide, polyamide, polyvinyl phenol, benzocyclobutene, acrylic, or epoxy; a siloxane material such as a siloxane resin; or an oxazole resin is formed.

Through the above steps, the semiconductor device can be manufactured.

As described in this embodiment mode, by the semiconductor device being provided, leak or short-circuit between the gate electrode and the semiconductor film in a level difference portion can be prevented even when the gate insulating film crosses the island-like semiconductor film. Further, even when a fixed charge due to a process is produced in the edge portion of the semiconductor film, it is possible to reduce the effect on a transistor characteristic due to the channel forming region in the edge portion of the semiconductor film. Furthermore, when the p-channel thin film transistor and the n-channel thin film transistor are provided over the same substrate, an impurity region to be formed in one of the thin film transistors (for example, the fourth impurity region 213c serving as an LDD region in this embodiment mode) and an impurity region (for example, the second impurity region 203c in this embodiment mode) to be formed in the other thin film transistor are provided by introduction of an impurity element at the same concentration, and accordingly, a process can be simplified.

This embodiment mode can be implemented by being freely combined with the above embodiment mode.

Embodiment Mode 3

In this embodiment mode, a semiconductor device and a manufacturing method thereof, which are different from the above embodiment modes, will be explained with reference to the drawings.

Figure 8A:
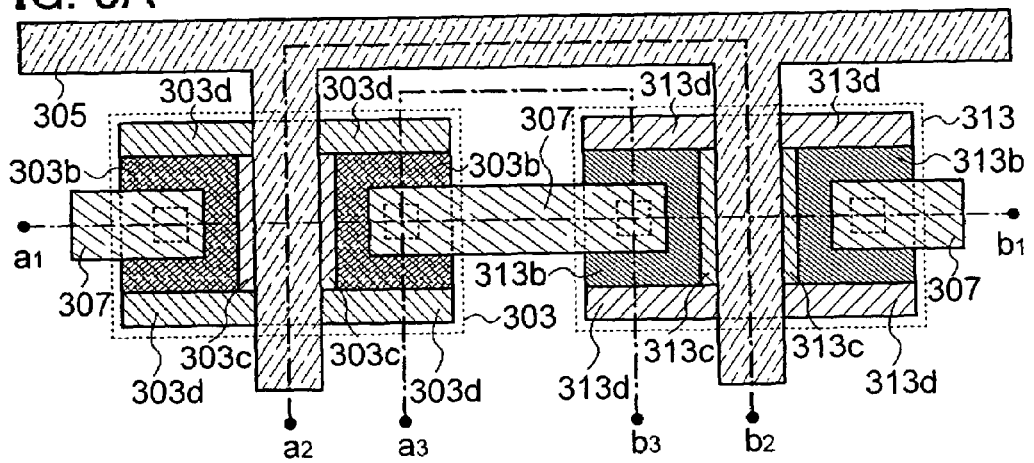
FIGS. 8A to 8D are views showing one example of a semiconductor device of the present invention.
Figure 8B:
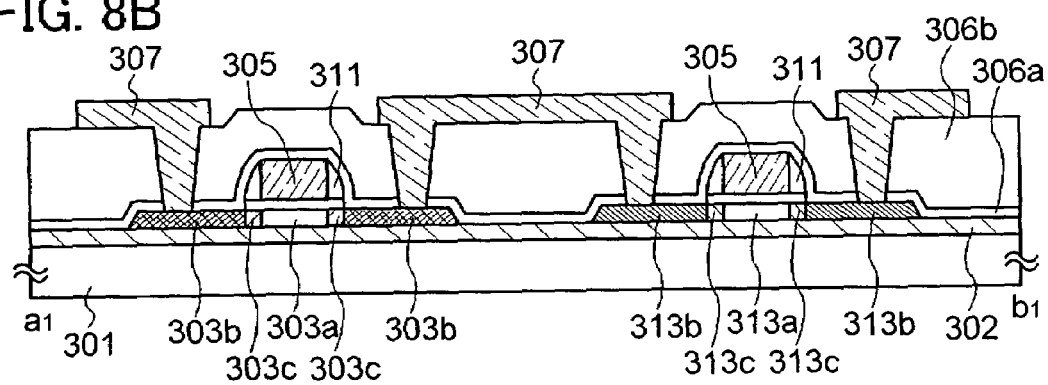
Figure 8C:
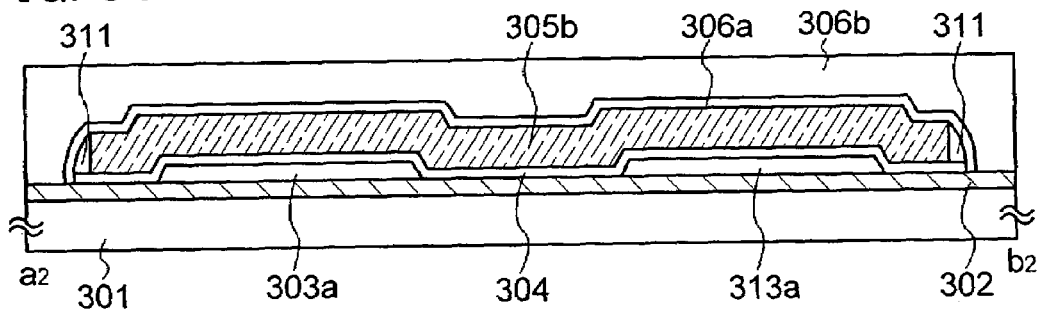
Figure 8D:
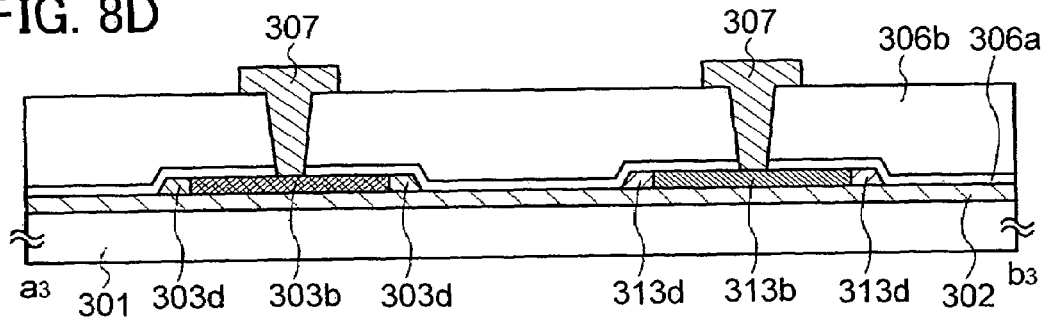

FIGS. 8A to 8D show a semiconductor device to be described in this embodiment mode. FIG. 8A is a top view of the semiconductor device to be described in this embodiment mode, FIG. 8B is a cross-sectional view taken along a line $a_1$-$b_1$ in FIG. 8A, FIG. 8C is a cross-sectional view taken along a line $a_2$-$b_2$ in FIG. 8A, and FIG. 8D is a cross-sectional view taken along a line $a_3$-$b_3$ in FIG. 8A.

A semiconductor device described in this embodiment mode has semiconductor films 303 and 313 each provided in an island-like shape over a substrate 301 with an insulating film 302 interposed between the substrate 301 and the semiconductor films 303 and 313; a conductive film 305 forming a gate electrode provided above the semiconductor films 303 and 313 with a gate insulating film 304 interposed between the conductive film 305 and the semiconductor films 303 and 313; insulating films 306a and 306b provided above the semiconductor films 303 and 313 so as to cover the conductive film 305; and a conductive film 307 forming a source electrode or drain electrode provided over the insulating film 306 (FIGS. 8A to 8D).

The conductive film 305 forming the gate electrode is provided so as to cross the island-like semiconductor films 303 and 313. Further, an insulating film 311 (also referred to as a sidewall) is provided so as to be in contact with the side face of the conductive film 305. Here, the conductive film 305 is provided so as to have a single-layer structure; however, as described in the above embodiment modes, a plurality of conductive films may be stacked.

The semiconductor film 303 provided in an island-like shape has a channel forming region 303a provided in a region which overlaps with the conductive film 305; a second impurity region 303c forming an LDD region provided so as to be adjacent to the channel forming region 303a, in a region which does not overlap with the conductive film 305; and a first impurity region 303b which form a source region or drain region, and a third impurity region 303d.

The first impurity region 303b is provided so as to be adjacent to the second impurity region 303c, and the second impurity region 303c is provided between the channel forming region 303a and the first impurity region 303b. The third impurity region 303d, which is in vicinity of a portion which overlaps with the conductive film 305 in the edge portion of the semiconductor film 303, is provided so as to be adjacent to the channel forming region 303a, the first impurity region 303b, and the second impurity region 303c.

The semiconductor film 313 provided in an island-like shape has a channel forming region 313a provided in a region which overlaps with the conductive film 305; a fifth impurity region 313c forming an LDD region, which is in a region which does not overlap with the conductive film 305, provided so as to be adjacent to the channel forming region 313a; and a fourth impurity region 313b forming a source region and a drain region and a sixth impurity region 313d.

The fourth impurity region 313b is provided so as to be adjacent to the fifth impurity region 313c, and the fifth impurity region 313c is provided between the channel forming region 313a and the fourth impurity region 313b. The sixth impurity region 313d, which is in vicinity of a portion which overlaps with the conductive film 305 in the edge portion of the semiconductor film 313, is provided so as to be adjacent to the channel forming region 313a, the fourth impurity region 313b, and the fifth impurity region 313c.

In this embodiment mode, the first impurity region 303b and the second impurity region 303c to be formed in the semiconductor film 303 are formed to be impurity regions having conductivity different from that of the third impurity region 303d. The fourth impurity region 313b and the fifth impurity region 313c to be formed in the semiconductor film 313 are formed to be impurity regions having conductivity different from that of the sixth impurity region 313d. The first impurity region 303b to be formed in the semiconductor film 303 is formed to be an impurity region having conductivity different from that of the fourth impurity region 313b to be formed in the semiconductor film 313.

In other words, the third impurity region 303d to be formed in the semiconductor film 303 and the fourth impurity region 313b and fifth impurity region 313c to be formed in the semiconductor film 313 have the same conductivity. In this case, the third impurity region 303d and fourth impurity region 313b or the third impurity region 303d and fifth impurity region 313c may be formed so as to have the same concentration of an impurity element contained therein. As a result, during a manufacturing process, the third impurity region 303d and fourth impurity region 313b or the third impurity region 303d and fifth impurity region 313c can be formed to be the same, and accordingly, a process can be simplified.

In addition, the sixth impurity region 313d to be formed in the semiconductor film 313 and the first impurity region 303b and second impurity region 303c to be formed in the semiconductor film 303 have the same conductivity. In this case, the sixth impurity region 313d and first impurity region 303b or the sixth impurity region 313d and second impurity region 303c may be formed to have the same concentration of an impurity element contained therein. As a result, during a manufacturing process, the sixth impurity region 313d and first impurity region 303b or the sixth impurity region 313d and second impurity region 303c can be formed to be the same, and accordingly, a process can be simplified.

For example, the first impurity region 303b forming a source region or drain region of the semiconductor film 303 can be provided to have p-type conductivity, the second impurity region 303c forming an LDD region of the semiconductor film 303 can be provided to have p-type conductivity, and the third impurity region 303d can be provided to have n-type conductivity. In this case, the fourth impurity region 313b forming a source region or drain region of the semiconductor film 313 and the fifth impurity region 313c forming an LDD region of the semiconductor film 313 are provided to have n-type conductivity, and the sixth impurity region 313d is provided to have p-type conductivity. Further, the second impurity region 303c and the sixth impurity region 313d can be provided so as to have the same concentration, and the third impurity region 303d and the fifth impurity region 313c can be provided so as to have the same concentration. Of course, the first impurity region 303b and the sixth impurity region 313d can be provided so as to have the same concentration, and the third impurity region 303d and the fourth impurity region 313b can be provided so as to have the same concentration.

The conductive film 307 forming a source electrode or drain electrode is provided so as to be electrically connected to the first impurity region 303b forming a source region or drain region of the semiconductor film 303 and the fourth impurity region 313b forming a source region or drain region of the semiconductor film 313, through an opening portion formed in the insulating films 306a and 306b. Further, as shown in FIGS. 8A to 8D, a CMOS circuit may be formed by electrical connection of the first impurity region 303b and the fourth impurity region 313b through the conductive film 307.

Next, one example of a manufacturing method of the semiconductor device shown in FIGS. 8A to 8D described above will be explained with reference to the drawings. FIGS. 9A to 9E are top views of FIGS. 8A to 8D, FIGS. 10A to 10F are cross-sectional views taken along a line $a_1$-$b_1$ in FIG. 8A, and FIGS. 11A to 11F are cross-sectional views taken along a line $a_3$-$b_3$ in FIG. 8A.

Figure 9A:
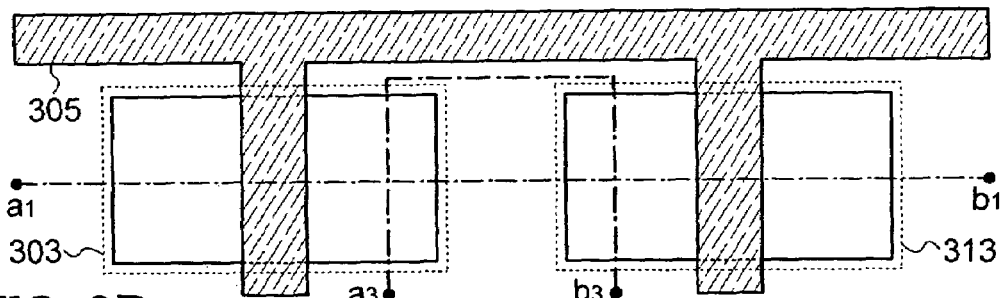
FIGS. 9A to 9E are views showing one example of a manufacturing method of a semiconductor device of the present invention.
Figure 10A:
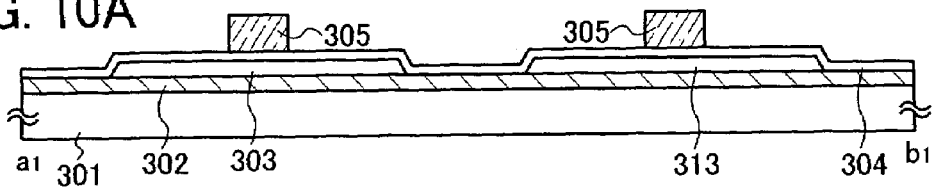
FIGS. 10A to 10F are views showing one example of a manufacturing method of a semiconductor device of the present invention.
Figure 11A:
FIGS. 11A to 11F are views showing one example of a manufacturing method of a semiconductor device of the present invention.

First, the island-like semiconductor films 303 and 313 are formed over the substrate 301 with the insulating film 302 interposed between the substrate 301 and the island-like semiconductor films 303 and 313. The conductive film 305 forming a gate electrode is formed above the island-like semiconductor films 303 and 313 with the gate insulating film 304 interposed between the conductive film 305 and the island-like semiconductor films 303 and 313 (FIGS. 9A, 10A, and 11A). The manufacturing method, the materials, and the like described in the above embodiment modes can be applied to each of the substrate 301, the insulating film 302, the semiconductor films 303 and 313, the gate insulating film 304, and the conductive film 305 also in this embodiment mode. Here, the conductive film 305 is provided so as to have a single-layer structure; however, as described in the above embodiment modes, a plurality of conductive films may be stacked.

Figure 9B:
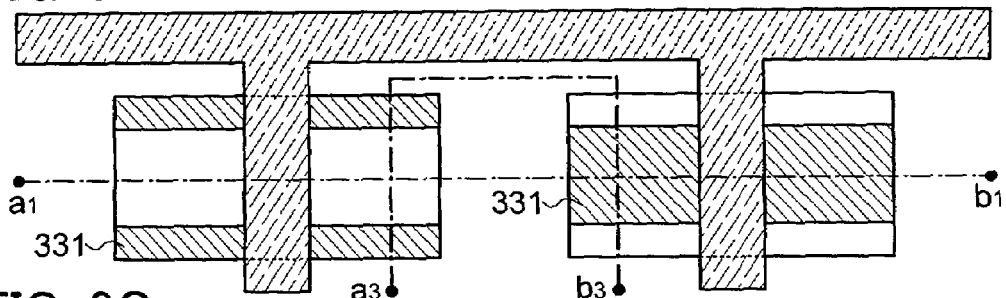
Figure 10B:
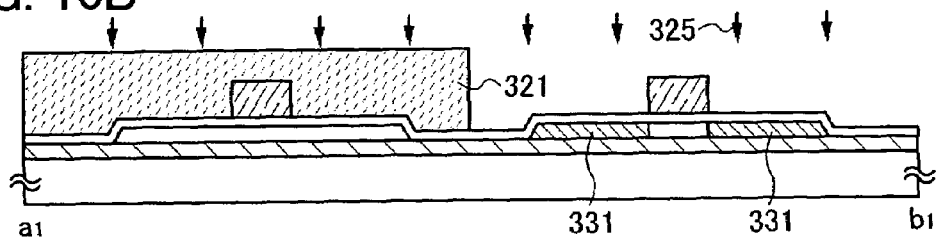
Figure 11B:
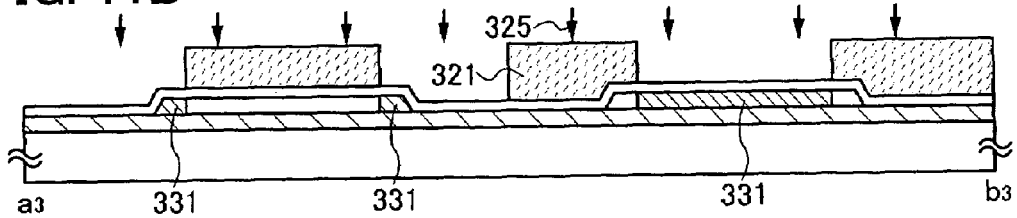

Then, a resist 321 is selectively formed above the semiconductor films 303 and 313, and an impurity element 325 is introduced into the semiconductor films 303 and 313 with the resist 321 and the conductive film 305 being used as masks, whereby an impurity region 331 is formed in the semiconductor films 303 and 313 (FIGS. 9B, 10B, and 11B). Here, the resist 321 is formed so that at least part of the edge portion of the semiconductor film 303 is exposed and so as to cover the edge portion of the semiconductor film 313.

As the impurity element 325, an impurity element imparting n-type conductivity or an impurity element imparting p-type conductivity can be used. As the impurity element imparting n-type conductivity, phosphorus (P), arsenic (As), or the like can be used. As the impurity element imparting p-type conductivity, boron (B), aluminum (Al), gallium (Ga), or the like can be used. Here, as the impurity element 325, phosphorus (P) is introduced into the semiconductor films 303 and 313 so as to be contained at a concentration of $1 \times 10^{15}/cm^3$ to $1 \times 10^{19}/cm^3$, whereby the impurity region 331 having n-type conductivity is formed.

Figure 9C:
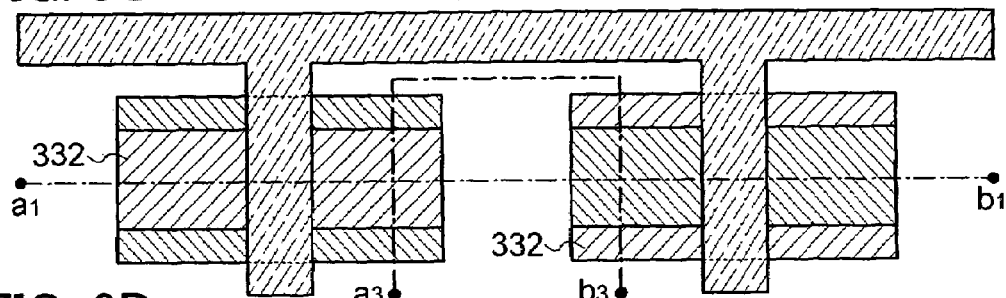
Figure 10C:
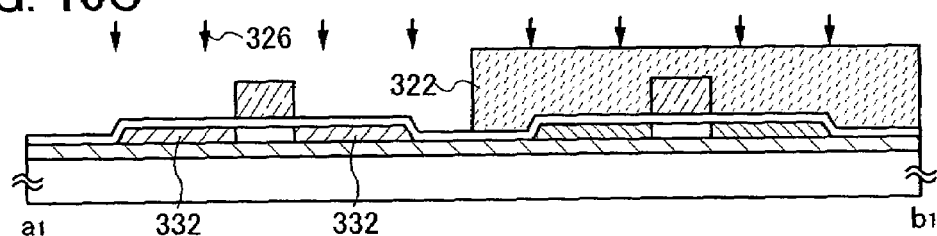
Figure 11C:
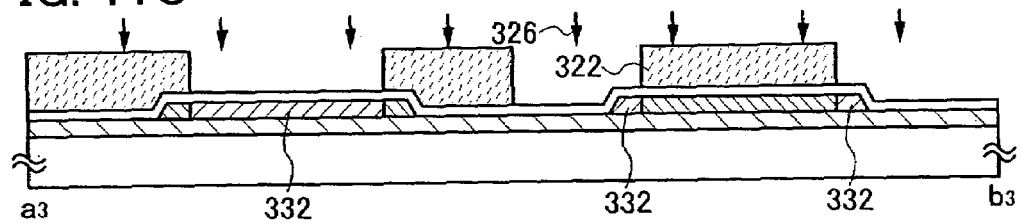

Then, a resist 322 is selectively formed above the semiconductor films 303 and 313, and an impurity element 326 is introduced into the semiconductor films 303 and 313 with the resist 322 and the conductive film 305 being used as masks, whereby an impurity region 332 is formed in the semiconductor films 303 and 313 (FIGS. 9C, 10C, and 11C). Here, the resist 322 is formed so as to cover the edge portion of the semiconductor film 303, and the resist 322 is formed so that at least part of the edge portion of the semiconductor film 313 (the vicinity of the edge portion of the semiconductor film 313 on the side which overlaps with the conductive film 305) is exposed.

As the impurity element 326, an impurity element imparting n-type conductivity or an impurity element imparting p-type conductivity can be used. As the impurity element imparting n-type conductivity, phosphorus (P), arsenic (As), or the like can be used. As the impurity element imparting p-type conductivity, boron (B), aluminum (Al), gallium (Ga), or the like can be used. As the impurity element 326, an impurity element having conductivity different from that of the impurity element 325 can be used. Here, as the impurity element 326, boron (B) is introduced into the semiconductor films 303 and 313 so as to be contained at a concentration of $1 \times 10^{15}/cm^3$ to $1 \times 10^{19}/cm^3$, whereby the impurity region 331 having n-type conductivity is formed.

Figure 9D:
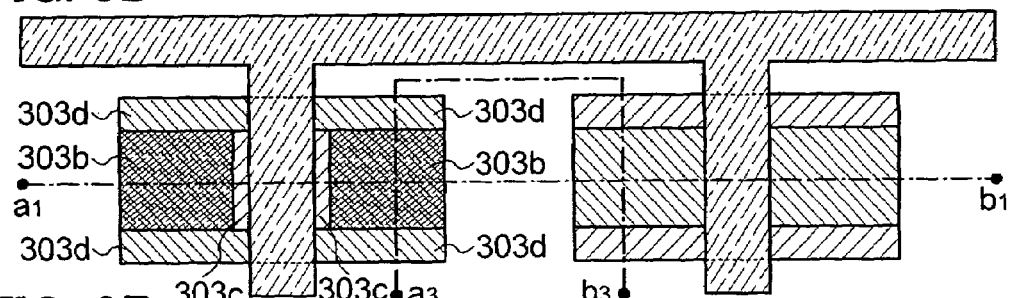
Figure 10D:
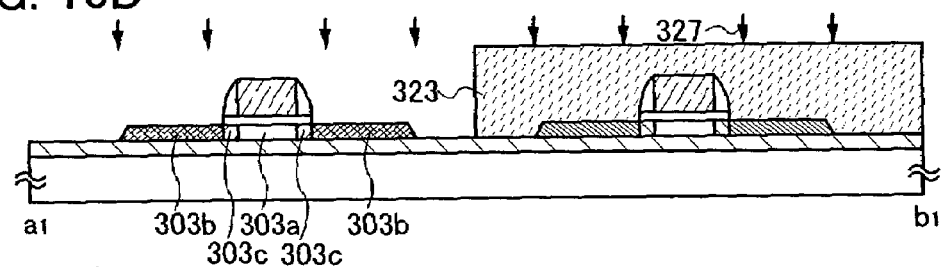
Figure 11D:
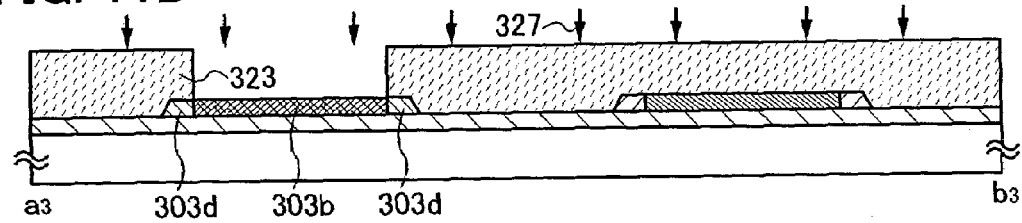

The insulating film 311 is formed so as to be in contact with the side face of the conductive film 305, and thereafter, a resist 323 is selectively provided so as to cover part of the edge portion of the semiconductor film 303 and the entire surface of the semiconductor film 313. Then, an impurity element 327 is introduced into the semiconductor film 303 with the resist 323, the conductive film 305, and the insulating film 311 being used as masks, whereby the channel forming region 303a, the first impurity region 303b, the second impurity region 303c, and the third impurity region 303d are formed in the semiconductor film 303 (FIGS. 9D, 10D, and 11D). The insulating film 311 is referred to as a sidewall in some cases, and the insulating film 311 serves as a mask when a low concentration impurity region (here, the second impurity region) is formed below the insulating film 311.

The channel forming region 303a is formed in a region of the semiconductor film 303 which overlaps with the conductive film 305 forming a gate electrode. The second impurity region 303c serving as an LDD region is formed in a region of the semiconductor film 303 which is adjacent to the channel forming region 303a and overlaps with the insulating film 311. The first impurity region 303b serving as a source region or drain region is formed so as to be adjacent to the second impurity region 303c. Here, a portion of the impurity region 332 into which the impurity element 327 is not introduced becomes the third impurity region 303d.

As the impurity element 327, an impurity element imparting n-type conductivity or an impurity element imparting p-type conductivity can be used. As the impurity element imparting n-type conductivity, phosphorus (P), arsenic (As), or the like can be used. As the impurity element imparting p-type conductivity, boron (B), aluminum (Al), gallium (Ga), or the like can be used. In this embodiment mode, as the impurity element 327, an impurity element having conductivity different from that of the impurity element 325 is used. Here, as the impurity element 327, boron (B) is introduced into the semiconductor film 303 so as to be contained at a concentration of $1 \times 10^{19}/cm^3$ to $1 \times 10^{20}/cm^3$, whereby the first impurity region 303b having p-type conductivity is formed.

Figure 9E:
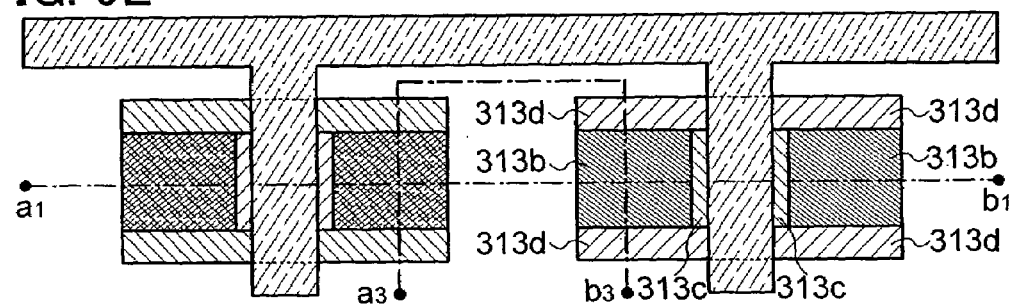
Figure 10E:
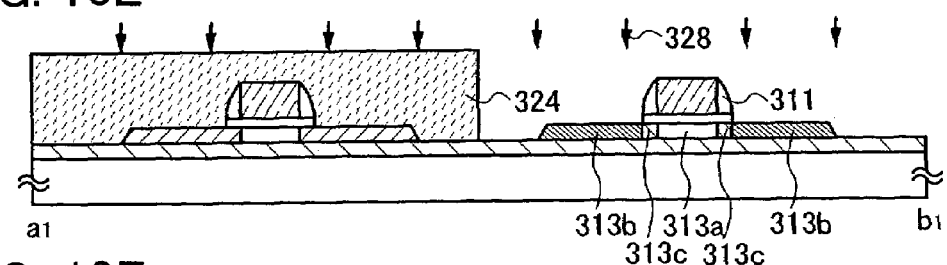
Figure 11E:
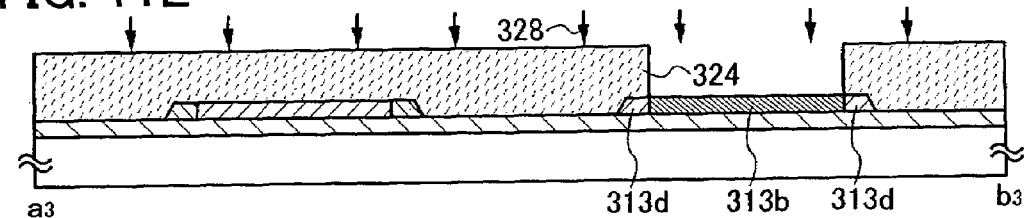

Then, after a resist 324 is selectively provided so as to cover the entire surface of the semiconductor film 303 and part of the edge portion of the semiconductor film 313, an impurity element 328 is introduced into the semiconductor film 313 with the resist 324, the conductive film 305, and the insulating film 311 being used as masks, whereby the channel forming region 313a, the fourth impurity region 313b, the fifth impurity region 313c, and the sixth impurity region 313d are formed in the semiconductor film 313 (FIGS. 9E, 10E, and 11E).

The channel forming region 313a is formed in a region of the semiconductor film 313 which overlaps with the conductive film 305 forming a gate electrode. The fifth impurity region 313c serving as an LDD region is formed in a region of the semiconductor film 313 which is adjacent to the channel forming region 313a and overlaps with the insulating film 311. The fourth impurity region 313b serving as a source region or drain region is formed so as to be adjacent to the fifth impurity region 313c. Here, a portion of the impurity region 331 into which the impurity element 328 is not introduced becomes the sixth impurity region 313d.

As the impurity element 328, an impurity element imparting n-type conductivity or an impurity element imparting p-type conductivity can be used. As the impurity element imparting n-type conductivity, phosphorus (P), arsenic (As), or the like can be used. As the impurity element imparting p-type conductivity, boron (B), aluminum (Al), gallium (Ga), or the like can be used. In this embodiment mode, as the impurity element 328, an impurity element having conductivity different from that of the impurity element 327 is used. Here, as the impurity element 328, phosphorus (P) is introduced into the semiconductor film 313 so as to be contained at a concentration of $1\times10^{19}/cm^3$ to $1\times10^{20}/cm^3$, whereby the fourth impurity region 313b having p-type conductivity is formed.

In this embodiment mode, the order of introduction of the impurity element 325 and the impurity element 326 into the semiconductor films 303 and 313 may be reversed. In this case, the impurity region 332 is formed in the semiconductor films 303 and 313 in advance, and thereafter, the impurity region 331 is formed in the semiconductor films 303 and 313. Further, the order of introduction of the impurity element 327 and the impurity element 328 into the semiconductor films 303 and 313 may be reversed. In this case, the fourth impurity region 313b, the fifth impurity region 313c, and the sixth impurity region 313d are formed in the semiconductor film 313 in advance, and thereafter, the first impurity region 303b, the second impurity region 303c, and the third impurity region 303d are formed in the semiconductor film 303.

Figure 10F:
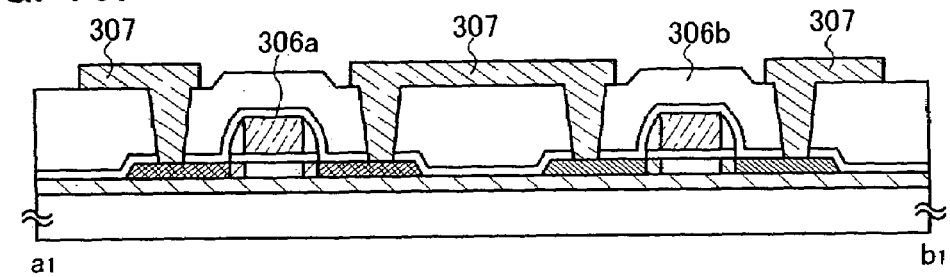
Figure 11F:
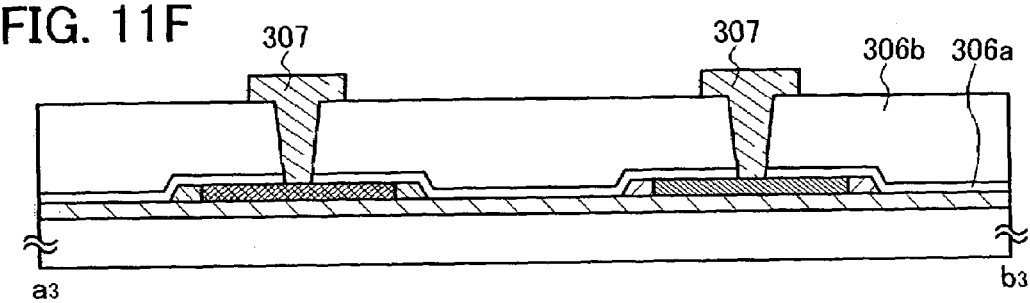

The insulating film 306a and the insulating film 306b are formed to be stacked so as to cover the conductive film 305, the semiconductor films 303 and 313, and the like, and the conductive film 307 serving as a source electrode or drain electrode is selectively formed over the insulating film 306b (FIGS. 10F and 11F). The conductive film 307 is provided so as to be electrically connected to the first impurity region 303b forming a source region or drain region of the semiconductor film 303 and the fourth impurity region 313b forming a source region or drain region of the semiconductor film 313. Further, in this embodiment mode, a CMOS circuit having a p-channel thin film transistor and an n-channel thin film transistor can be formed by electrical connection of the conductive film 307 which is electrically connected to the first impurity region 303b and the conductive film 307 which is electrically connected to the fourth impurity region 313b.

The manufacturing method, the materials, and the like described in Embodiment Mode 1 can also be applied to each of the insulating film 306a, the insulating film 306b, and the conductive film 307 in this embodiment mode. Here, as the insulating film 306a, silicon oxide, silicon oxynitride (SiOxNy) (x>y>0), or silicon nitride oxide (SiNxOy) (x>y>0) formed by a CVD method is formed. As the insulating film 306b, an organic material such as polyimide, polyamide, polyvinyl phenol, benzocyclobutene, acrylic, or epoxy; a siloxane material such as a siloxane resin; or an oxazole resin is formed.

Through the above steps, the semiconductor device can be manufactured.

Further, in this embodiment mode, in order to control a threshold value or the like, an impurity element may be introduced into the semiconductor films 303 and 313 at low concentration before the conductive film 305 serving as a gate electrode is formed. In this case, an impurity element is also included in the channel forming regions 303a and 313a in the semiconductor films 303 and 313. As the impurity element, an impurity element imparting n-type conductivity or an impurity element imparting p-type conductivity can be used.

As the impurity element imparting n-type conductivity, phosphorus (P), arsenic (As), or the like can be used. As the impurity element imparting p-type conductivity, boron (B), aluminum (Al), gallium (Ga), or the like can be used. Further, the impurity region formed by introduction of an impurity element in advance can be utilized as the third impurity region 303d or the sixth impurity region 313d. In this case, the step of FIG. 9B or FIG. 9C described above can be omitted.

As described in this embodiment mode, by the semiconductor device being provided, leak or short-circuit between the gate electrode and the semiconductor film in a level difference portion can be prevented even when the gate insulating film crosses the island-like semiconductor film. Further, even when a fixed charge due to a process is produced in the edge portion of the semiconductor film, it is possible to reduce the effect on a transistor characteristic due to the channel forming region of the edge portion of the semiconductor film. Furthermore, when the p-channel thin film transistor and the n-channel thin film transistor are provided over the same substrate, impurity regions (for example, the second impurity region 303c and the fourth impurity region 313c in this embodiment mode) serving as an LDD region to be formed in one of the thin film transistors and impurity regions (for example, the sixth impurity region 313d and the third impurity region 303d in this embodiment mode) to be formed in the other thin film transistor are provided by introduction of an impurity element at the same concentration, and accordingly, a process can be simplified.

This embodiment mode can be implemented by being freely combined with the above embodiment modes.

Embodiment Mode 4

In this embodiment mode, an example of a usage mode of a semiconductor device obtained by using the manufacturing method described in the above embodiment mode will be explained. Specifically, an application example of a semiconductor device in which data can be inputted/outputted without contact will be explained hereinafter with reference to the drawings. The semiconductor device in which data can be inputted/outputted without contact is also referred to as an RFID tag, an ID tag, an IC tag, an IC chip, an RF tag, a wireless tag, an electronic tag, or a wireless chip depending on the usage.

First, an example of a top-surface structure of a semiconductor device shown in this embodiment mode will be explained with reference to FIG. 13A. A semiconductor device 80 shown in FIGS. 13A to 13C includes a thin film integrated circuit 131 provided with a plurality of elements such as thin film transistors included in a memory portion and a logic portion and a conductive film 132 serving as an antenna. The conductive film 132 serving as an antenna is electrically connected to the thin film integrated circuit 131.

When a thin film transistor is provided in the thin film integrated circuit 131, the structure described in the above embodiment mode can be applied.

Figure 13A:
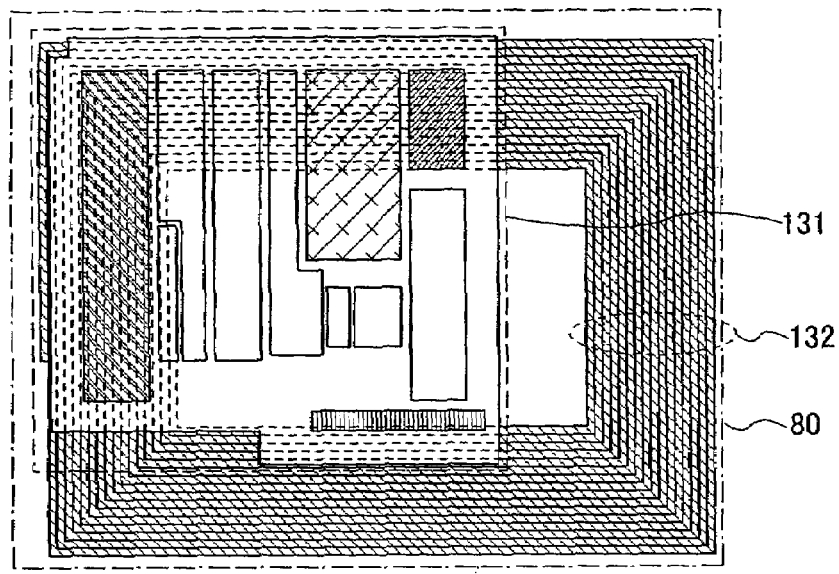
FIGS. 13A to 13C are views showing one example of a usage mode of a semiconductor device of the present invention.
Figure 13B:
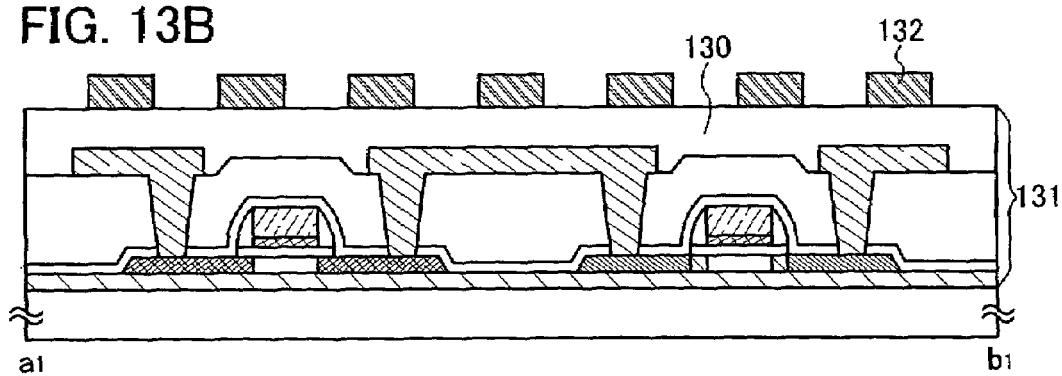
Figure 13C:
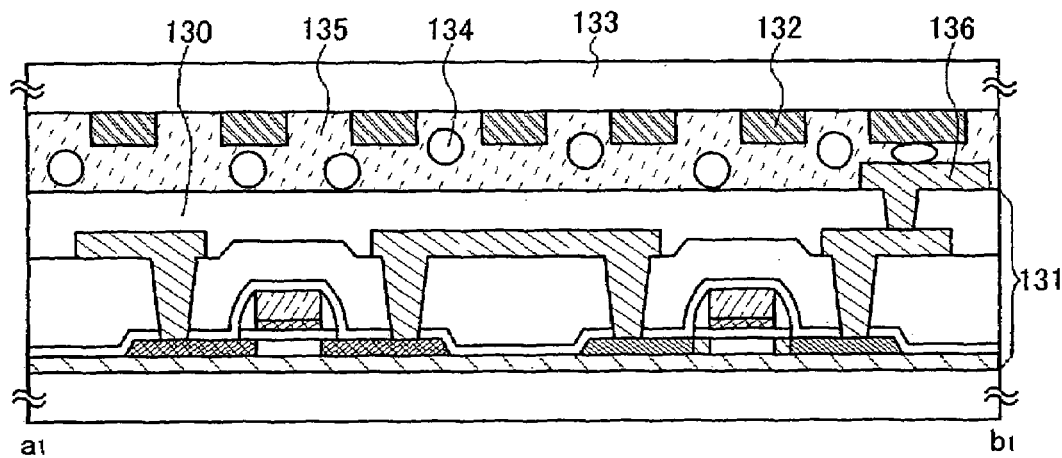

FIGS. 13B and 13C are schematic views of a cross section of FIG. 13A. The conductive film 132 serving as an antenna may be provided above the elements included in the memory portion and the logic portion; for example, the conductive film 132 serving as an antenna can be provided above the structure shown in the embodiment modes described above, with an insulating film 130 interposed therebetween (FIG. 13B). In addition, a conductive film 132 serving as an antenna can be provided so as to be attached to a thin film integrated circuit 131 after the conductive film 132 serving as an antenna is provided separately for a substrate 133 (FIG. 13C). Here, a conductive film 136 provided over an insulating film 130 and the conductive film 132 serving as an antenna are electrically connected to each other through a conductive particle 134 included in a resin 135 having adhesiveness.

Although this embodiment mode shows an example in which the conductive film 132 serving as an antenna is provided in a coil-like shape and an electromagnetic induction method or an electromagnetic coupling method is applied, the semiconductor device of the present invention is not limited thereto, and a microwave method can also be applied. In a case of a microwave method, the shape of the conductive film 132 serving as an antenna may be appropriately determined depending on the wavelength of an electromagnetic wave to be used.

Figure 14A:
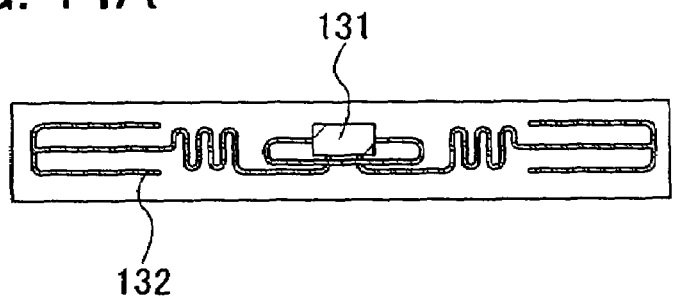
FIGS. 14A to 14D are views showing one example of a usage mode of a semiconductor device of the present invention.
Figure 14B:
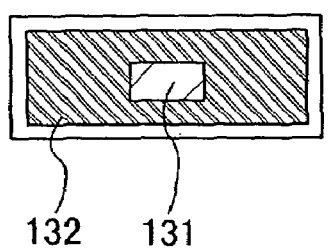
Figure 14C:
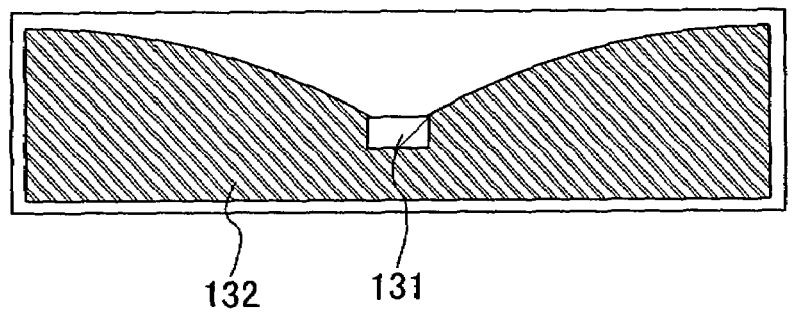
Figure 14D:
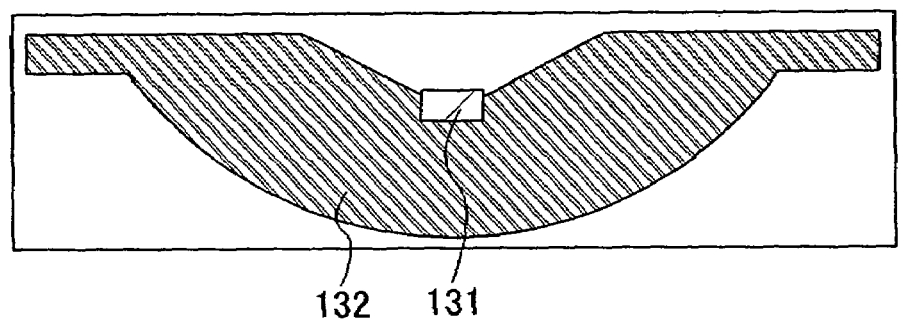

For example, in a case of employing, for example, a microwave method (for example, a UHF band (860 to 960 MHz band), a 2.45 GHz band, or the like) as the signal transmission method in the semiconductor device 80, the shape such as a length of the conductive layer serving as an antenna may be appropriately set in consideration of a wavelength of an electromagnetic wave used for signal transmission. For example, the conductive film serving as an antenna can be formed into a linear shape (for example, a dipole antenna (FIG. 14A)), a flat shape (for example, a patch antenna (FIG. 14B)), a ribbon shape (FIGS. 14C and 14D), or the like. The shape of the conductive film 132 serving as an antenna is not limited to a linear shape, and the conductive film serving as an antenna may be provided into a curved-line shape, a meander shape, or a combination thereof, in consideration of a wavelength of an electromagnetic wave.

The conductive film 132 serving as an antenna is formed using a conductive material by a CVD method, a sputtering method, a printing method such as screen printing or gravure printing, a droplet discharging method, a dispenser method, a plating method, or the like. The conductive material is formed using a single-layer structure of an element of aluminum (Al), titanium (Ti), silver (Ag), copper (Cu), gold (Au), platinum (Pt), nickel (Ni), palladium (Pd), tantalum (Ta), and molybdenum (Mo), or an alloy material or a compound material containing these elements as its main component; or a stacked structure thereof.

For example, in a case of forming the conductive film 132 serving as an antenna by, for example, a screen printing method, the conductive film can be provided by selective printing of conductive paste in which conductive particles each having a grain size of several nm to several tens of μm are dissolved or dispersed in an organic resin. As the conductive particles, one or more of metal particles such as silver (Ag), gold (Au), copper (Cu), nickel (Ni), platinum (Pt), palladium (Pd), tantalum (Ta), molybdenum (Mo), and titanium (Ti), fine particles of silver halide, or dispersible nanoparticles can be used. In addition, as the organic resin included in the conductive paste, one or a plurality of organic resins each serving as a binder, a solvent, a dispersant, or a coating of the metal particle can be used. Typically, an organic resin such as an epoxy resin or a silicon resin can be used. In forming a conductive film, baking is preferably performed after the conductive paste is pushed out. For example, in a case of using fine particles (the grain size of which is greater than or equal to 1 nm and less than or equal to 100 nm) containing silver as its main component as a material of the conductive paste, a conductive film can be obtained by curing the conductive paste by baking at temperatures of 150 to 300° C. Alternatively, fine particles containing solder or lead-free solder as its main component may be used; in this case, it is preferable to use a fine particle having a grain size of less than or equal to 20 μm. Solder or lead-free solder has an advantage such as low cost.

Next, an operation of the semiconductor device shown in this embodiment mode will be explained.

Figure 15A:
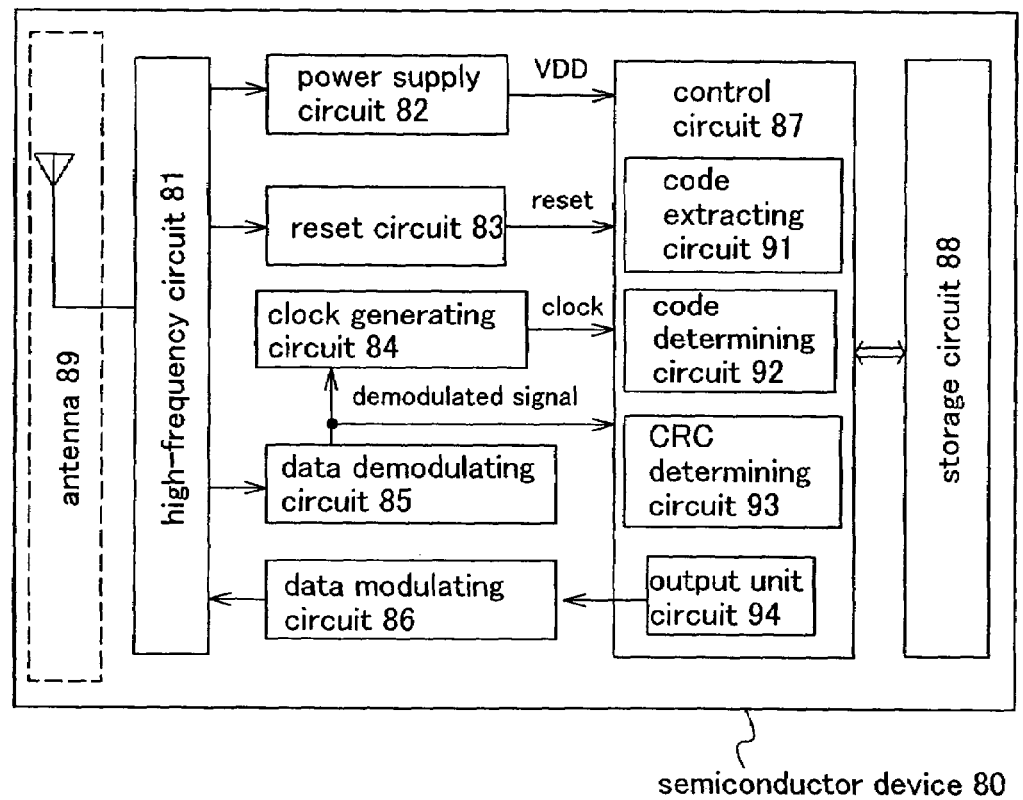
FIGS. 15A to 15C are views showing one example of a usage mode of a semiconductor device of the present invention.

The semiconductor device 80 has a function of exchanging data without contact, and has a high-frequency circuit 81, a power supply circuit 82, a reset circuit 83, a clock generating circuit 84, a data demodulating circuit 85, a data modulating circuit 86, a control circuit 87 for controlling another circuit, a storage circuit 88, and an antenna 89 (FIG. 15A). The high-frequency circuit 81 receives a signal from the antenna 89 and outputs a signal, which is received from the data modulating circuit 86, from the antenna 89. The power supply circuit 82 generates a power supply potential from a received signal. The reset circuit 83 generates a reset signal. The clock generating circuit 84 generates various clock signals based on a received signal inputted from the antenna 89. The data demodulating circuit 85 demodulates a received signal and outputs the demodulated signal to the control circuit 87. The data modulating circuit 86 modulates a signal received from the control circuit 87. As the control circuit 87, for example, a code extracting circuit 91, a code determining circuit 92, a CRC determining circuit 93, and an output unit circuit 94 are provided. It is to be noted that the code extracting circuit 91 extracts each of plural codes included in an instruction sent to the control circuit 87. The code determining circuit 92 determines the content of the instruction by comparing the extracted code with a code corresponding to a reference. The CRC determining circuit 93 detects whether or not there is a transmission error or the like based on the determined code.

In FIG. 15A, the high-frequency circuit 81 that is an analog circuit, and the power supply circuit 82 are included in addition to the control circuit 87.

Subsequently, an example of an operation of the aforementioned semiconductor device will be explained. First, a wireless signal is received by the antenna 89 and then sent to the power supply circuit 82 through the high-frequency circuit 81, thereby generating a high power supply potential (hereinafter referred to as VDD). The VDD is supplied to each circuit in the semiconductor device 80. A signal sent to the data demodulating circuit 85 via the high-frequency circuit 81 is demodulated (hereinafter this signal is referred to as a demodulated signal). Moreover, signals passed through the reset circuit 83 and the clock generating circuit 84 via the high-frequency circuit 81, and the demodulated signal are sent to the control circuit 87. The signals sent to the control circuit 87 are analyzed by the code extracting circuit 91, the code determining circuit 92, the CRC determining circuit 93, and the like. Then, based on the analyzed signals, the information of the semiconductor device stored in the storage circuit 88 is outputted. The outputted information of the semiconductor device is encoded through the output unit circuit 94. Further, the encoded information of the semiconductor device 80 passes through the data modulating circuit 86 and then is sent by the antenna 89. It is to be noted that a low power supply potential (hereinafter referred to as VSS) is common in the plural circuits included in the semiconductor device 80 and VSS can be GND.

In this manner, when a signal is sent from a reader/writer to the semiconductor device 80 and the signal sent from the semiconductor device 80 is received by the reader/writer, the data in the semiconductor device can be read.

Moreover, in the semiconductor device 80, power supply voltage may be supplied to each circuit by electromagnetic waves without mounting a power supply (battery), or a power supply (battery) may be mounted so that power supply voltage is supplied to each circuit by both electromagnetic waves and the power supply (battery).

Figure 15B:
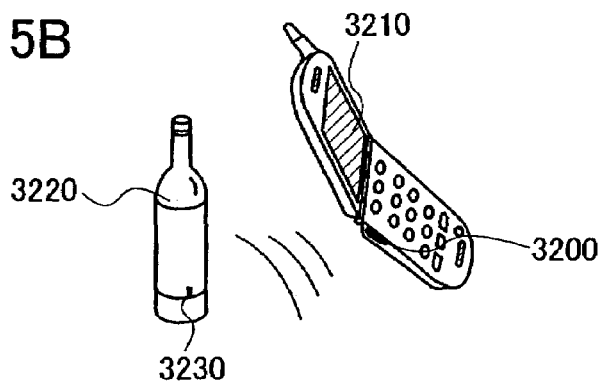
Figure 15C:
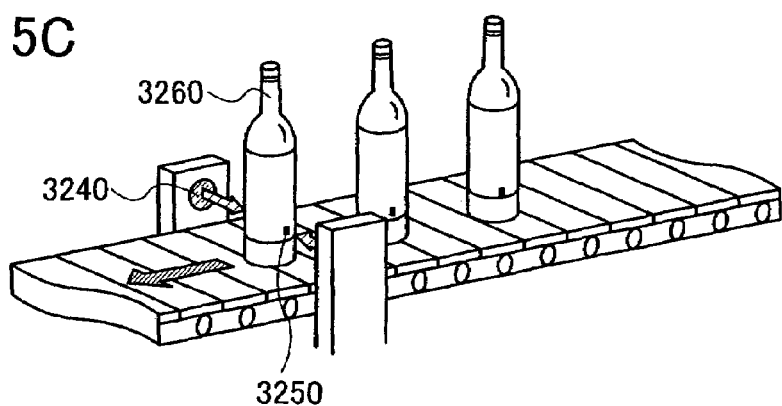
Figure 16A:
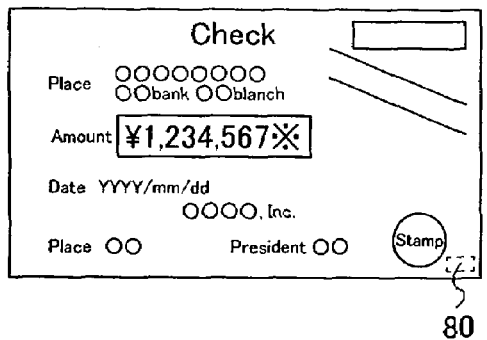
FIGS. 16A to 16H are views showing one example of a usage mode of a semiconductor device of the present invention.
Figure 16B:
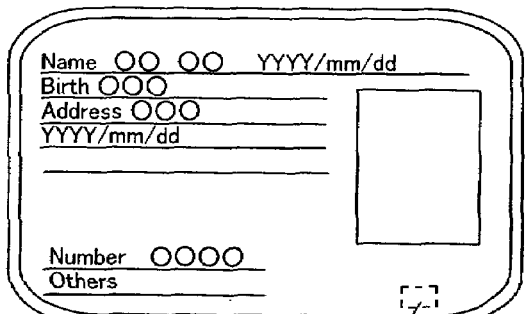
Figure 16C:
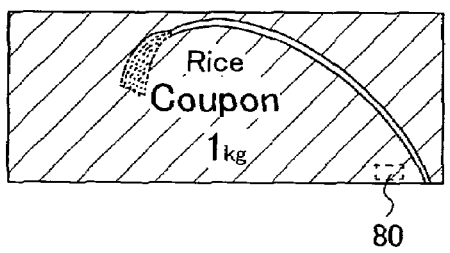
Figure 16D:
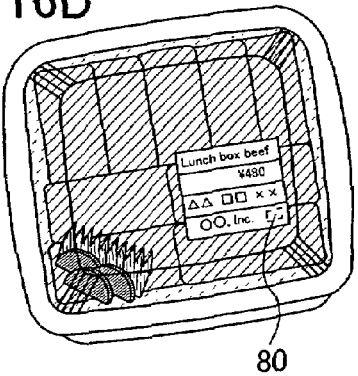
Figure 16E:
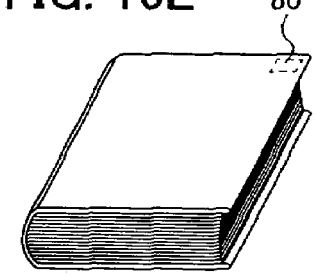
Figure 16F:
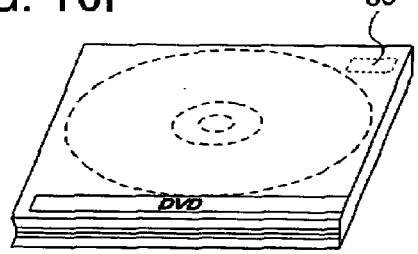
Figure 16G:
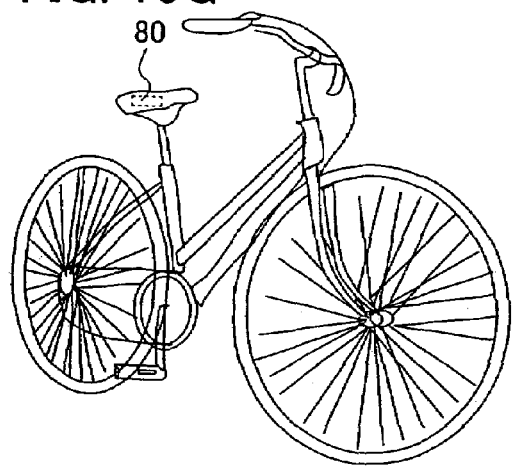
Figure 16H:
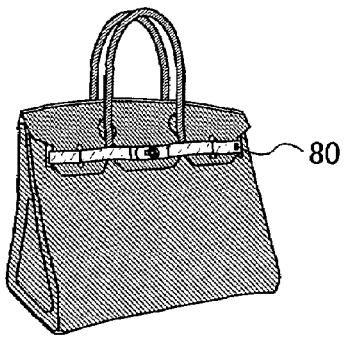
Figure 17A:
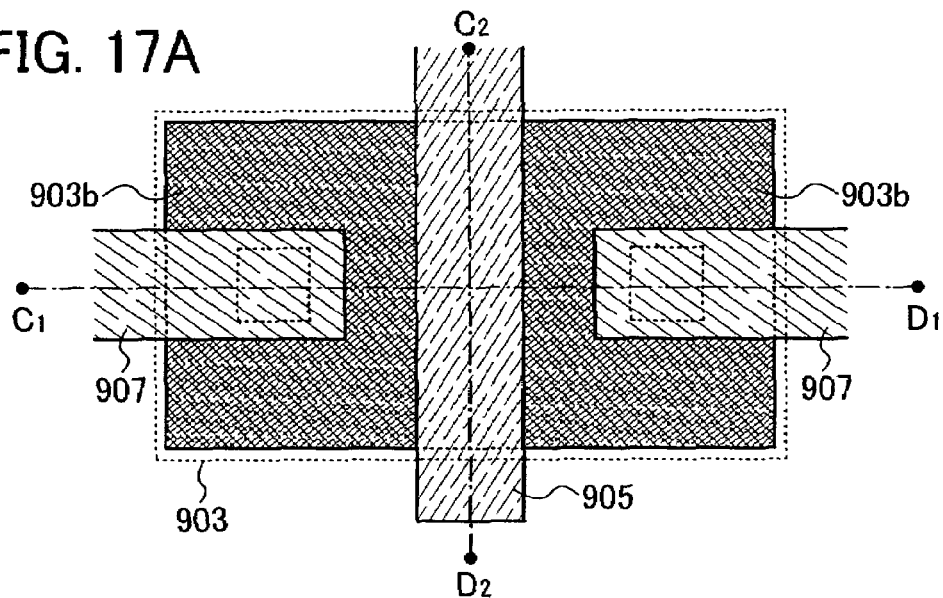
FIGS. 17A to 17C are views showing one example of a conventional semiconductor device.
Figure 17B:
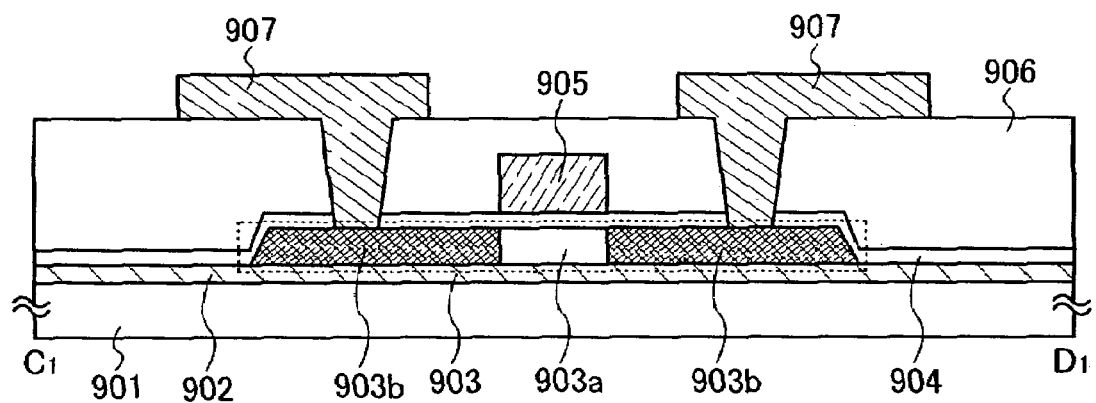
Figure 17C:
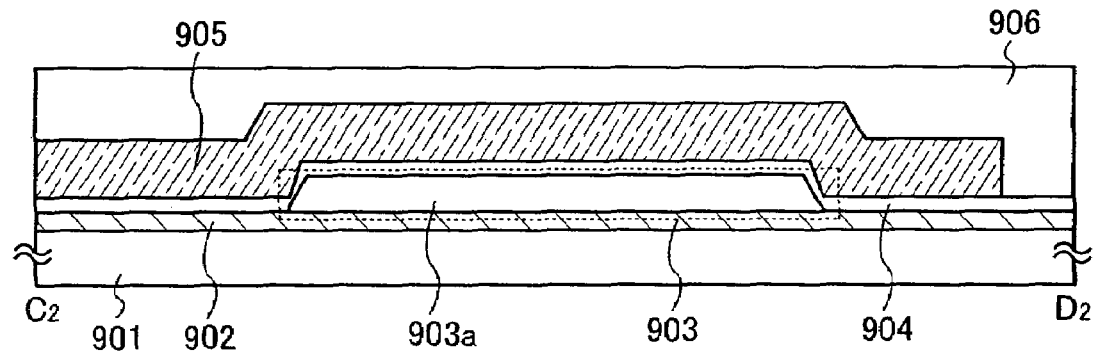

Next, an example of a usage mode of a semiconductor device in which data can be inputted/outputted without contact will be explained. A side surface of a mobile terminal including a display portion 3210 is provided with a reader/writer 3200. A side surface of a product 3220 is provided with a semiconductor device 3230 (FIG. 15B). When the reader/writer 3200 is held over the semiconductor device 3230 included in the product 3220, the display portion 3210 displays information on the product, such as a material, a production area, an inspection result for each production step, history of circulation process, and description of the product. In addition, when a product 3260 is transferred by a conveyer belt, the product 3260 can be inspected with the use of a semiconductor device 3250 provided for the product 3260 and a reader/writer 3240 (FIG. 15C). In this manner, with the use of the semiconductor device in the system, information can be obtained easily and higher performance and higher value addition are achieved.

In addition to the above, the semiconductor device of the present invention can be applied in a wide range. The semiconductor device can be applied to any product in which the information such as history of an object can be clarified without contact effectively for production, management, and so on. For example, the semiconductor device of the present invention can be provided and used for bills, coins, securities, certificates, bearer bonds, containers for wrapping, books, storage media, personal belongings, vehicles, groceries, garments, health products, daily commodities, medicines, electronic appliances, and the like. Examples of these will be explained with reference to FIGS. 16A to 16H.

The bills and coins are money that is distributed in the market, and include one that can be used in the same way as money in a specific area (such as cash voucher), a commemorative coin, and the like. The securities indicate a check, certificate, a promissory note, and the like (see FIG. 16A). The certificates indicate a driver's license, a resident's card, and the like (see FIG. 16B). The bearer bonds indicate a stamp, a rice coupon, various gift coupons, and the like (see FIG. 16C). The containers for wrapping indicate a wrapper for a packaged lunch and the like, a plastic bottle, and the like (see FIG. 16D). The books indicate a paperback book, a hardback book, and the like (see FIG. 16E). The storage media indicate DVD software, a video tape, and the like (see FIG. 16F). The vehicles indicate a wheeled vehicle such as a bicycle, a ship, and the like (see FIG. 16G). The personal belongings indicate a bag, glasses, and the like (see FIG. 16H). The groceries indicate foods, beverages, and the like. The garments indicate clothes, shoes, and the like. The health products indicate a medical apparatus, a health appliance, and the like. The daily commodities indicate furniture, a lighting apparatus, and the like. The medicines indicate a drug, an agricultural chemical, and the like. The electronic appliances indicate a liquid crystal display device, an EL display device, a television device (television receiver or thin television receiver), a cellular phone, and the like.

By the semiconductor device 80 being provided for bills, coins, securities, certificates, bearer bonds, and the like, forgery thereof can be prevented. In addition, by the semiconductor device 80 being provided for containers for wrapping, books, storage media, personal belongings, groceries, daily commodities, electronic appliances, and the like, efficiency of an inspection system, a system of a rental store, and the like can be improved. By the semiconductor device 80 being provided for vehicles, health products, medicines, and the like, forgery and theft thereof can be prevented, and accidental ingestion of a drug can be prevented in the case of the medicines. The semiconductor device 80 can be provided by being attached to a surface of an article or being implanted in an article. For example, the semiconductor device can be implanted in paper in the case of a book, and can be implanted in an organic resin in the case of a package formed of the organic resin.

By the semiconductor devices being provided for containers for wrapping, storage media, personal belongings, groceries, garments, daily commodities, electronic appliances, and the like, an inspection system and a system of a rental store, and the like can be made efficient. By the semiconductor devices being provided for vehicles, forgery and theft thereof can be prevented. By implantation of the semiconductor devices in creatures such as animals, identification of the individual creature can be easily carried out. For example, by implantation of the semiconductor device equipped with a sensor in a creature such as livestock, it is possible to easily know not only a year of birth, sex, and kind but also a health condition such as body temperature.

This embodiment mode can be implemented by being freely combined with the above embodiment modes.

Embodiment 1

In this embodiment, an electrical characteristic of a transistor included in the semiconductor device described in the above embodiment modes will be explained with reference to the drawings. Specifically, a result of inspection (simulation) of an electrical characteristic when a transistor is operated will be described.

As the inspection, with respect to a current-voltage characteristic (hereinafter also referred to as "electrical characteristic") of a transistor in a case where an electric charge was trapped in the edge portion of the semiconductor film due to some sort of a cause, electrical characteristics of a transistor with the second impurity region shown in FIGS. 1A to 1D described above and a transistor without the second impurity region were compared with each other. In this embodiment, the inspection was performed on the assumption that a negative charge is accumulated in the edge portion of the semiconductor film.

First, the accumulation of a negative fixed charge was assumed in the edge portion of the semiconductor film 103 which overlaps with the conductive film 105, and inspection was performed on a current (Id)-voltage (Vg) characteristic of a transistor accompanied with surface density of the fixed charge to be accumulated (FIGS. 19A to 19D). This is because it is considered that some sort of a fixed charge is trapped in a manufacturing process in the edge portion of the semiconductor film 103, from an experiment.

Here, the edge portion of the semiconductor film 103 was formed into a tapered shape having an angle of 45°, the accumulation of a negative fixed charge $Qf_e$ was assumed in the edge portion of the semiconductor film 103, and the accumulation of a negative fixed charge $Qf_m$ ($1\times10^{11}/cm^2$) at an interface between the semiconductor film 103a and the gate insulating film 104, other than the edge portion of the semiconductor film 103, was assumed. The inspection was performed under the condition where the channel length L of the transistor was 1 μm and the channel width thereof W was 10 μm. Further, in this embodiment, the inspection was performed under the condition where the concentration of $Qf_e$ was set to (a): $1\times10^{12}/cm^2$, (b): $2\times10^{12}/cm^2$, and (c): $3\times10^{12}/cm^2$.

Figure 19A:
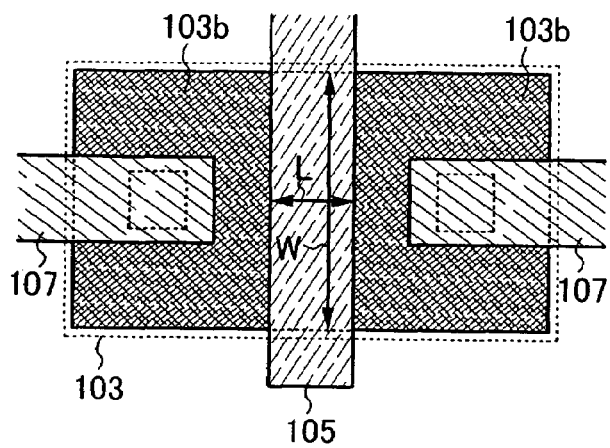
FIGS. 19A to 19D are explanatory views and graphs of an embodiment of a semiconductor device of the present invention.
Figure 19B:
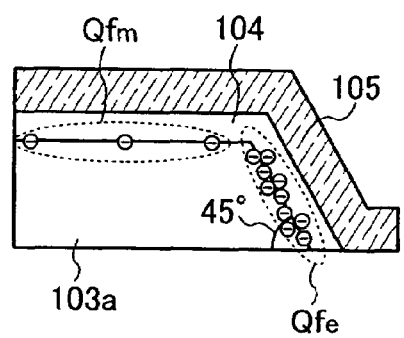
Figure 19C:
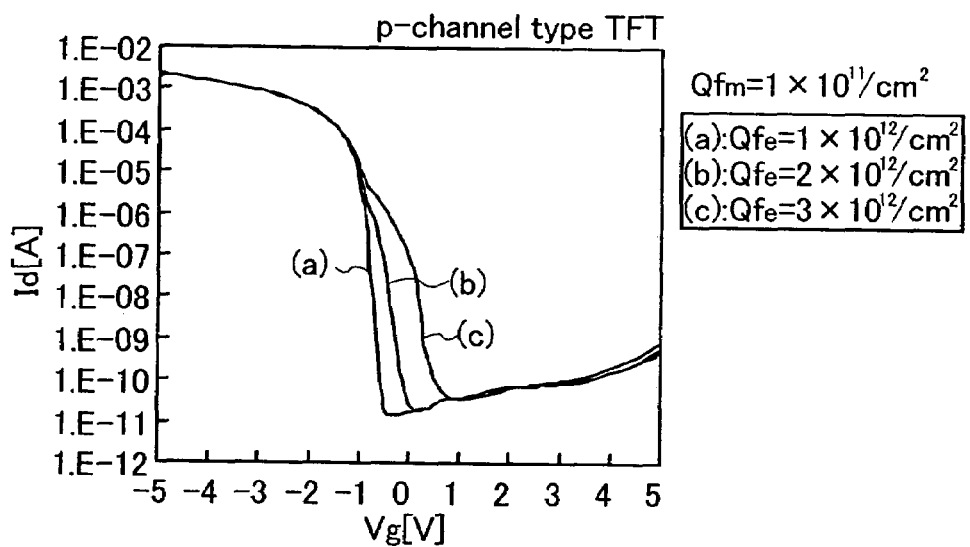
Figure 19D:
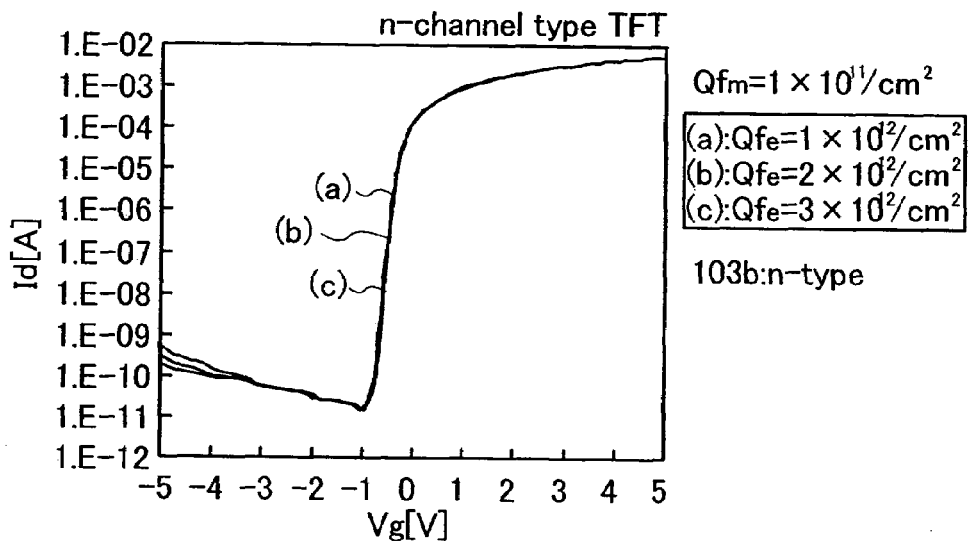

FIGS. 19C and 19D show the inspection result of a current-voltage characteristic of a transistor at this time. FIG. 19C shows a current-voltage characteristic of a p-channel transistor, and FIG. 19D shows a current-voltage characteristic of an n-channel transistor. In a case of a p-channel transistor, the first impurity region 103b forming a source region or drain region was assumed to have p-type conductivity (the concentration of $1\times10^{20}$/cm$^3$), and in a case of an n-channel transistor, the first impurity region 103b was assumed to have n-type conductivity (the concentration of $1\times10^{20}$/cm$^3$).

In the case of the p-channel transistor, a result was obtained, in which a current-voltage characteristic of the transistor was changed as the concentration of a fixed charge (Qf$_e$) in the edge portion of the semiconductor film 103 was increased. Further, it was found that a threshold voltage was changed as the concentration of Qf$_e$ was changed, whereby the current-voltage characteristic of the transistor was affected more significantly. On the other hand, in the case of the n-channel transistor, a current-voltage characteristic of the transistor was not affected even when the concentration of a fixed charge (Qf$_e$) in the edge portion of the semiconductor film was changed.

As a reason thereof, it is considered that, in the p-channel transistor, an edge transistor and a main transistor are formed in the edge portion and the central portion of the semiconductor film 103, respectively, and the edge transistor and the main transistor each having a different threshold value are connected in parallel, whereby a current-voltage characteristic 920 of a transistor is affected (FIG. 20A). In particular, in the p-channel transistor, a negative fixed charge is accumulated in the edge portion of the semiconductor film 103; therefore, a current-voltage characteristic 920 of the entire transistors was significantly affected by a current-voltage characteristic 922 of the edge transistor and a current-voltage characteristic 921 of the main transistor, and accordingly, a kink 925 was generated.

On the other hand, in the n-channel transistor, although an edge transistor and a main transistor are formed in the same manner, a fixed charge to be accumulated in the edge portion of the semiconductor film 103 is negative. Therefore, it is considered that a current-voltage characteristic 921 of the edge transistor is hidden by a current-voltage characteristic of the main transistor, whereby a current-voltage characteristic 920 of the entire transistors is not affected (FIG. 20B). In a case where a fixed charge to be formed in the semiconductor film 103 is positive, current-voltage characteristics of the p-channel transistor and the n-channel transistor are reversed.

Figure 21A:
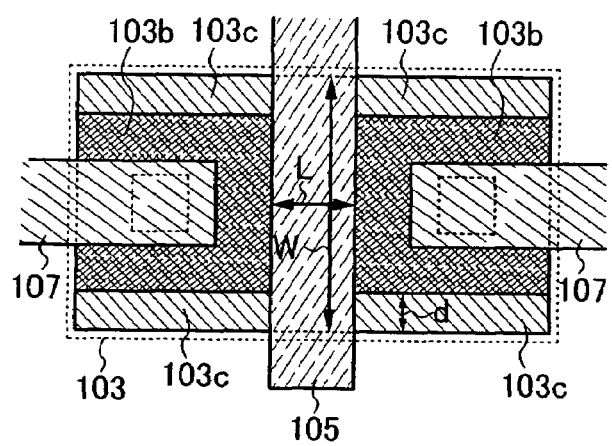
FIGS. 21A to 21C are explanatory views and graphs of an embodiment of a semiconductor device of the present invention.
Figure 21B:
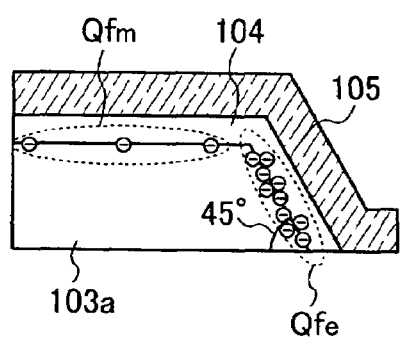
Figure 21C:
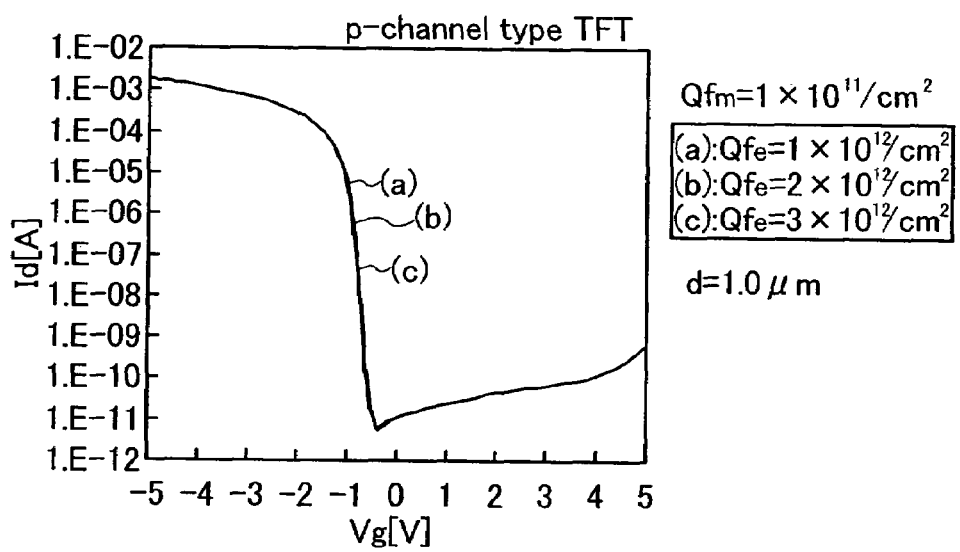

Then, as described in the above embodiment mode, inspection was performed with respect to a current (Id)-voltage (Vg) characteristic of a transistor in a case where a second impurity region 103c was provided in the edge portion of the semiconductor film 103 which overlapped with the conductive film 105, so as to be in contact with the channel forming region 103a and the first impurity region 103b (FIGS. 21A to 21C). Here, the edge portion of the semiconductor film 103 was formed into a tapered shape having an angle of 45°, the accumulation of a negative fixed charge Qf$_e$ was assumed in the edge portion of the semiconductor film 103, and the accumulation of a negative fixed charge Qf$_m$ ($1\times10^{11}$/cm$^2$) was assumed at an interface between the semiconductor film 103a and the gate insulating film 104, other than the edge portion of the semiconductor film 103. The inspection was performed under the condition where the channel length L of the transistor was 1 μm, the channel width W thereof was 10 μm, and the width d (the length of the second impurity region 103c in a direction almost parallel to the conductive film 105) of the second impurity region 103c was 1 μm. Further, in this embodiment, the inspection was performed under the condition where the concentration of Qf$_e$ was set to (a): $1\times10^{12}$/cm$^2$, (b): $2\times10^{12}$/cm$^2$, and (c): $3\times10^{12}$/cm$^2$.

FIG. 21C shows a current-voltage characteristic of a p-channel transistor at this time. Here, the first impurity region 103b forming a source region or drain region was assumed to have p-type conductivity ($1\times10^{20}$/cm$^3$), and the second impurity region 103c was assumed to have n-type conductivity ($1\times10^{17}$/cm$^3$).

FIG. 21C shows that a current-voltage characteristic of a transistor was not affected even in a case of the p-channel transistor and a case where a negative fixed charge was trapped in the edge portion of the semiconductor film 103. Even in a case where the concentration of a fixed charge (Qf$_e$) in the edge portion of the semiconductor film was increased, a current-voltage characteristic of the transistor was not affected. It is considered that this is because the second impurity region 103c having opposite conductivity to that of the first impurity region 103b forming a source region or drain region is provided in the edge portion of the semiconductor film 103 which overlaps with the conductive film 105, whereby the second impurity region 103c serves as a stopper of a parasitic channel formed in the edge portion. As a result, it was found that, with the use of the structure shown in the present invention, change in current-voltage characteristic of the transistor could be suppressed even in a case where an electric charge was trapped due to some sort of a cause by a manufacturing process or the like in the edge portion of the semiconductor film.

Figure 22A:
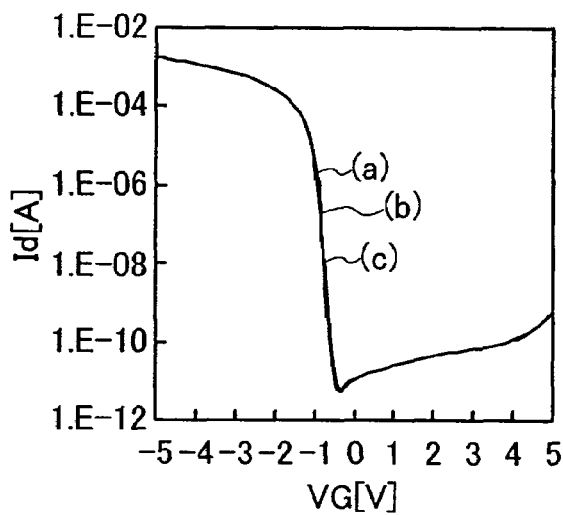
FIGS. 22A to 22C are explanatory graphs of an embodiment of a semiconductor device of the present invention.
Figure 22B:
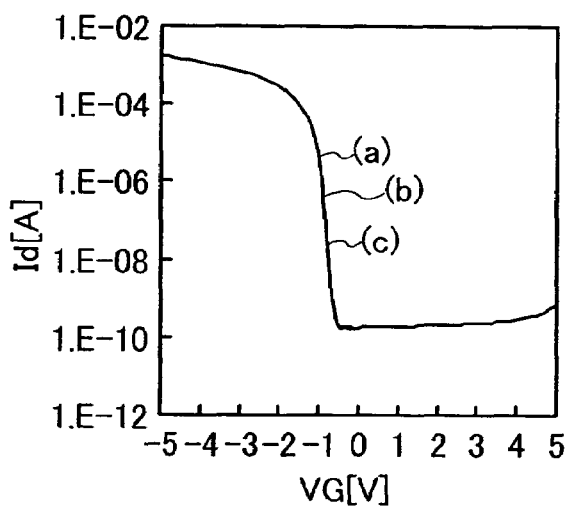
Figure 22C:
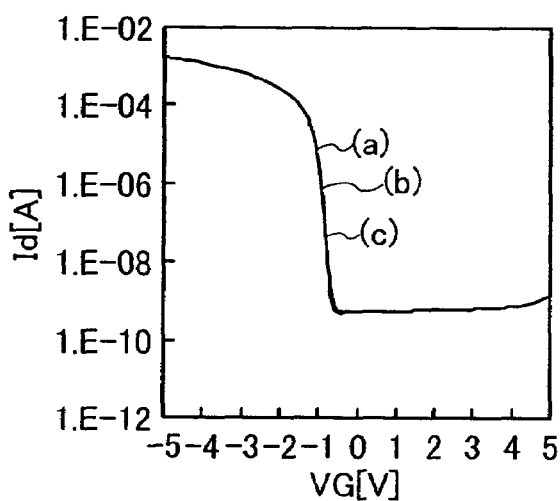

FIGS. 22A to 22C show the inspection result of a current-voltage characteristic of a transistor when the concentration of the second impurity region 103c is changed in the structure shown in FIGS. 21A to 21C described above. The inspection was performed under the condition where the concentration of Qf$_e$ was set to (a): $1\times10^{12}$/cm$^2$, (b): $2\times10^{12}$/cm$^2$, and (c): $3\times10^{12}$/cm$^2$.

FIG. 22A shows the inspection result of a current-voltage characteristic of a p-channel transistor in a case where the concentration of the second impurity region 103c is $1\times10^{17}$/cm$^3$ (n-type); FIG. 22B, the concentration of the second impurity region 103c is $1\times10^{18}$/cm$^3$ (n-type); and FIG. 22C, the concentration of the second impurity region 103c is $1\times10^{19}$/cm$^3$ (n-type).

FIGS. 22A to 22C show the increase in OFF current of a transistor as the concentration of the second impurity region 103c is increased. It is considered that the cause thereof is that an OFF current passing through the second impurity region 103c easily flows as the concentration of the second impurity region 103c is increased. Therefore, it is preferable that the concentration of the second impurity region 103c be greater than or equal to $1\times10^{17}$/cm$^3$ and less than $1\times10^{18}$/cm$^3$.

Next, FIGS. 23A to 23D show the inspection result of a current-voltage characteristic of a transistor when the width d of the second impurity region 103c is changed. The inspection was performed under the condition where the concentration of Qf$_e$ was set to (a): $1\times10^{12}$/cm$^2$, (b): $2\times10^{12}$/cm$^2$, and (c): $3\times10^{12}$/cm$^2$.

Figure 23A:
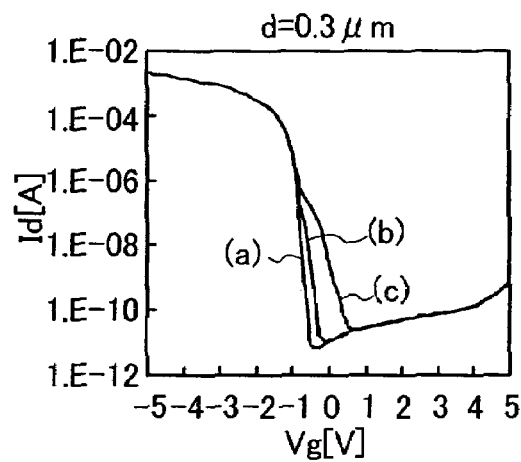
FIGS. 23A to 23D are explanatory graphs of an embodiment of a semiconductor device of the present invention.
Figure 23B:
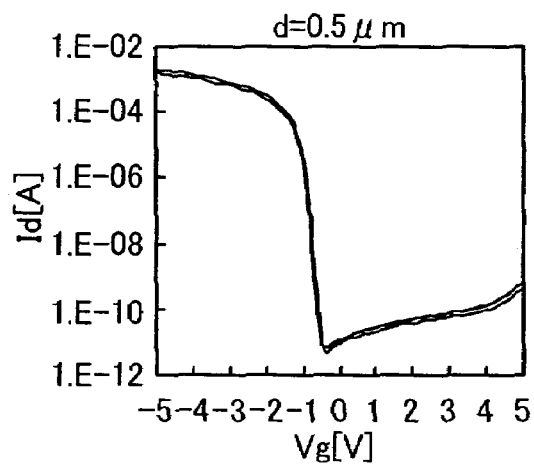
Figure 23C:
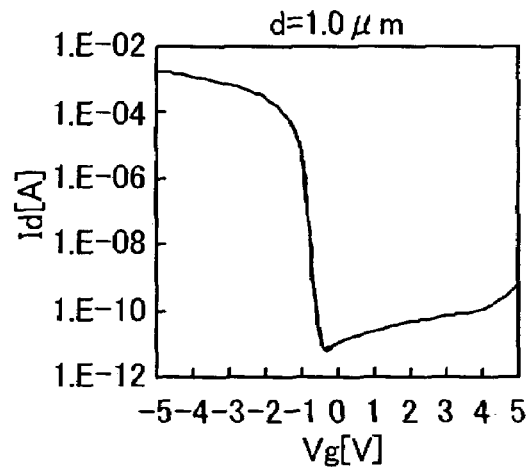
Figure 23D:
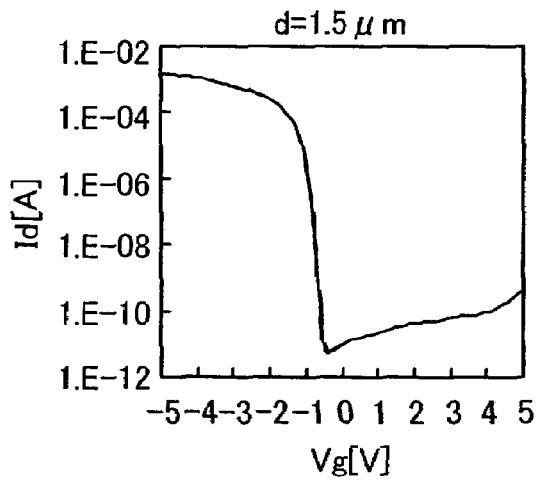

FIG. 23A shows the measurement result of a current-voltage characteristic of a transistor in a case of d=0.3 μm; FIG. 23B, d=0.5 μm; FIG. 23C, d=1.0 μm; and FIG. 23D, d=1.5 μm. When the width d of the second impurity region is not sufficient, similarly to the structure shown in FIGS. 19A to 19D described above, a result was obtained, in which a current-voltage characteristic of a transistor was changed as the concentration of a fixed charge (Qf$_e$) in the edge portion of the semiconductor film was increased (FIG. 23A). Further, it was found that a threshold voltage was changed as the concentration of $Qf_e$ was changed, and a current-voltage characteristic of the transistor was affected.

From the results described above, even in a case where the semiconductor device including a p-channel transistor and an n-channel transistor is provided, as described in Embodiment Mode 2, an impurity region serving as a stopper of a parasitic channel (for example, the second impurity region 103c (FIGS. 1A to 1D) or the second impurity region 203c (FIGS. 4A to 4D)) is provided only in one transistor, whereby it is possible to reduce the effect of a characteristic of the edge portion of the channel forming region of the semiconductor film, on a transistor characteristic.

This application is based on Japanese Patent Application serial No. 2006-062435 filed in Japan Patent Office on Mar. 8, 2006, the entire contents of which are hereby incorporated by reference.

What is claimed is:

1. A semiconductor device comprising:
a semiconductor film formed over a substrate; and
a gate electrode formed over the semiconductor film, with a gate insulating film interposed therebetween, so as to cross the semiconductor film,
wherein the semiconductor film includes:
  a channel forming region provided in a region which overlaps with the gate electrode, with the gate insulating film interposed therebetween;
  a first impurity region forming a source region or drain region, provided so as to be adjacent to the channel forming region; and
  two second impurity regions, each provided so as to be adjacent to the channel forming region and the first impurity region, and opposed to each other with the first impurity region interposed therebetween,
wherein the first impurity region and the two second impurity regions have different conductivity, and
wherein the two second impurity regions and the channel forming region have different conductivity.

2. The semiconductor device according to claim 1,
wherein the second impurity region, which is in an edge portion of the semiconductor film, is provided in a vicinity of a region which overlaps with the gate electrode.

3. A semiconductor device comprising:
a semiconductor film formed over a substrate; and
a gate electrode formed over the semiconductor film, with a gate insulating film interposed therebetween, so as to cross the semiconductor film,
wherein the semiconductor film includes:
  a channel forming region provided in a region which overlaps with the gate electrode, with the gate insulating film interposed therebetween;
  a first impurity region forming a source region or drain region, provided so as to be adjacent to the channel forming region; and
  a second impurity region provided so as to be adjacent to the channel forming region and the first impurity region,
wherein the first impurity region and the second impurity region have different conductivity, and
wherein the second impurity region and the channel forming region have same conductivity and different concentration.

4. The semiconductor device according to claim 3,
wherein the second impurity region, which is in an edge portion of the semiconductor film, is provided in a vicinity of a region which overlaps with the gate electrode.

* * * * *